US012658876B2

(12) United States Patent
Cueva et al.

(10) Patent No.: US 12,658,876 B2
(45) Date of Patent: Jun. 16, 2026

(54) SUPPRESSION OF PARASITIC ACOUSTIC WAVES IN INTEGRATED CIRCUIT DEVICES

(71) Applicant: MACOM Technology Solutions Holdings, Inc., Lowell, MA (US)

(72) Inventors: Gabriel R. Cueva, Bedford, NH (US); Timothy E. Boles, Tyngsboro, MA (US); Wayne Mack Struble, Franklin, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 594 days.

(21) Appl. No.: 18/001,141

(22) PCT Filed: Jun. 18, 2021

(86) PCT No.: PCT/US2021/038050
§ 371 (c)(1),
(2) Date: Dec. 8, 2022

(87) PCT Pub. No.: WO2021/257965
PCT Pub. Date: Dec. 23, 2021

(65) Prior Publication Data
US 2023/0216471 A1     Jul. 6, 2023

Related U.S. Application Data

(60) Provisional application No. 63/058,589, filed on Jul. 30, 2020, provisional application No. 63/041,361, filed on Jun. 19, 2020.

(51) Int. Cl.
H10D 30/47     (2025.01)
H03H 9/02      (2006.01)
(Continued)

(52) U.S. Cl.
CPC .... H03H 9/02125 (2013.01); H03H 9/02102 (2013.01); H10D 30/475 (2025.01);
(Continued)

(58) Field of Classification Search
CPC .. H10D 30/475; H10D 62/114; H10D 62/357; H10D 62/82; H10D 64/111;
(Continued)

(56) References Cited

U.S. PATENT DOCUMENTS 6,559,471 B2 * 5/2003 Finder ................... H10F 77/164
                                                257/14
7,745,848 B1 6/2010 Rajagopal et al.
(Continued)

FOREIGN PATENT DOCUMENTS

CN        104319238 B  * 12/2018  ............. H10D 84/05
WO   WO-2018120363 A1 * 7/2018  ....... H01L 21/02507

OTHER PUBLICATIONS

International Search Report and Written Opinion for PCT/US2021/038050 mailed Nov. 26, 2021.
(Continued)

*Primary Examiner* — Shahed Ahmed
(74) *Attorney, Agent, or Firm* — Perilla Knox & Hildebrandt LLP; Jason M. Perilla

(57)     ABSTRACT

Structures for suppressing parasitic acoustic waves in semi-conductor structures and integrated circuit devices are described. Such integrated circuit devices can, typically, produce undesirable acoustic wave resonances, and the acoustic waves can degrade the performance of the devices. In that context, some embodiments described herein relate to spoiling a conductive path that participates in the generation of acoustic waves. Some embodiments relate to spoiling acoustic characteristics of an acoustic resonant structure that may be present in the vicinity of the device. Combined
(Continued)

embodiments that spoil the conductive path and acoustic characteristics are also possible.

22 Claims, 12 Drawing Sheets

(51) Int. Cl.
    *H10D 62/10*      (2025.01)
    *H10D 62/17*      (2025.01)
    *H10D 62/82*      (2025.01)
    *H10D 64/00*      (2025.01)

(52) U.S. Cl.
    CPC ......... *H10D 62/114* (2025.01); *H10D 62/357* (2025.01); *H10D 62/82* (2025.01); *H10D 64/111* (2025.01)

(58) Field of Classification Search
    CPC ............. H10D 64/112; H10D 62/8503; H10D 64/251; H10D 30/47–485; H10D 30/015; H10D 62/812–8181; H01L 21/761; H01L 21/7605; H01L 21/02507
    See application file for complete search history.

(56)             References Cited

U.S. PATENT DOCUMENTS

| | | |
|---|---|---|
| 2010/0140665 A1 | 6/2010 | Singbal et al. |
| 2015/0090957 A1 | 4/2015 | Tomabechi et al. |
| 2015/0318353 A1 | 11/2015 | Roberts et al. |
| 2016/0099309 A1 | 4/2016 | Derluyn et al. |
| 2019/0198623 A1 | 6/2019 | Yue et al. |
| 2019/0229114 A1 | 7/2019 | Boles et al. |

OTHER PUBLICATIONS

Extended European Search Report for Application No. 21826132.9 mailed Sep. 11, 2024.

* cited by examiner

SUPPRESSION OF PARASITIC ACOUSTIC WAVES IN INTEGRATED CIRCUIT DEVICES

CROSS-REFERENCE TO RELATED APPLICATIONS

This application is a 35 U.S.C. § 371 national stage patent application of Patent Cooperation Treaty application number PCT/US2021/038050, filed Jun. 18, 2021, and titled "SUPPRESSION OF PARASITIC ACOUSTIC WAVES IN INTEGRATED CIRCUIT DEVICES," which claims the benefit of priority to U.S. Provisional Ser. Application No. 63/041,361, filed Jun. 19, 2020, titled "Suppression of Parasitic Acoustic Waves in Integrated Circuit Devices," and also claims the benefit of priority to U.S. Provisional Ser. Application No. 63/058,589, filed Jul. 30, 2020, titled "Suppression of Parasitic Acoustic Waves in Integrated Circuit Devices," the entire contents of each of which is hereby incorporated herein by reference.

BACKGROUND

Applications involving wireless communications, radar, microwave heating, and remote sensing, among others, can require circuits that produce high-frequency signals (e.g., radio-frequency (RF) or microwave signals) at relatively high power levels. Such circuits can include integrated circuit devices, including integrated transistors, capacitors, diodes, inductors, and other devices that handle such high power levels. Examples of active semiconductor devices include field effect transistors (FETs), junction field effect transistors (JFETs), high-electron-mobility transistors (HEMTs), bipolar junction transistors (BJTs), composite transistors, unidirectional and bi-directional silicon controlled rectifiers (SCRs), and thyristors, among other active devices.

In general, a transistor is an active semiconductor device used to amplify or switch signals and electric power. A transistor typically includes three terminals for connections to external circuitry. A voltage or current applied to one terminal of the transistor directs and controls a flow of charge through another pair of terminals of the transistor. Because the extent of charge and power that passes through the transistor can be greater than the amount of power necessary to control it, a transistor can be said to amplify a signal. Today, some power transistors are packaged individually, but many power transistors, in various configurations, are formed together on the same substrate.

Transistors can be formed using a number of different semiconductor materials and semiconductor manufacturing processes. Example semiconductor materials include the group IV elemental semiconductor materials, including Silicon (Si) and Germanium (Ge), compounds thereof, and the group III elemental semiconductor materials, including Aluminum (Al), Gallium (Ga), and Indium (In), and compounds thereof. Semiconductor transistor amplifiers can be constructed from group III-V direct bandgap semiconductor technologies, in certain cases, as the higher bandgaps and electron mobility provided by those devices can lead to higher electron velocity and breakdown voltages, among other benefits.

SUMMARY

Structures for suppressing parasitic acoustic waves in semiconductor structures and integrated circuit devices are described. Such integrated circuit devices can, typically, produce undesirable acoustic wave resonances, and the acoustic waves can degrade the performance of the devices. In that context, some embodiments described herein relate to spoiling a conductive path that participates in the generation of acoustic waves. Some embodiments relate to spoiling acoustic characteristics of an acoustic resonant structure that may be present in the vicinity of the device. Combined embodiments that spoil the conductive path and acoustic characteristics are also possible.

In one example, a semiconductor structure includes a substrate formed from a first base semiconductor material, an interface layer formed over the substrate, the interface layer being formed from the first base semiconductor material, and a number of epitaxial layers formed over the interface layer from a second base semiconductor material. The number of epitaxial layers include a transition layer formed over the interface layer, and a conduction layer formed over the transition layer, where the interface layer is formed to have an opposite doping type as compared to the transition layer. In one case, the first base semiconductor material can be silicon and the second base semiconductor material is gallium nitride material.

In some cases, the semiconductor structure includes a diode junction between the interface layer and the transition layer. In some cases, a doping concentration in the interface layer is between $0.5\times10^{19}$ cm$^{-3}$ and $2\times10^{19}$ cm$^{-3}$. The doping concentration in the interface layer can be uniform throughout the interface layer to within 20%. The doping concentration in the interface layer can be less than an elastic limit of the first base semiconductor material. The interface layer can be formed to have a graded doping profile as a function of depth, with a peak doping concentration near an interface between the interface layer and the transition layer.

In some cases, the substrate is formed to include at least one resistive region as compared to an intrinsic region of the first base semiconductor material. The at least one resistive region can be resistive in a range between 3,000 ohm-cm to 10,000 ohm-cm.

In another example, a semiconductor structure includes a substrate formed from a first base semiconductor material, an interface layer formed over the substrate, the interface layer being formed from the first base semiconductor material, and a number of epitaxial layers formed over the interface layer from a second base semiconductor material. The number of epitaxial layers include a transition layer formed over the interface layer, and a conduction layer formed over the transition layer, where the substrate is capacitively coupled to the epitaxial layers through the interface layer. In one case, the first base semiconductor material is silicon and the second base semiconductor material is gallium nitride material.

In some cases, the interface layer is resistive in a range between 3,000 ohm-cm to 10,000 ohm-cm. The substrate can be formed to include at least one conductive region as compared to an intrinsic region of the first base semiconductor material. The at least one conductive region can have a resistivity of less than 0.2 ohm-cm.

In some cases, the epitaxial layers include a superlattice structure, the superlattice structure includes repeating pairs of layers, each pair of layers in the repeating pairs of layers includes a first layer of semiconductor material and a second layer of semiconductor material, a ratio of a thickness of the first layer of semiconductor material layer to a thickness of the second layer of semiconductor material layer is constant in the superlattice structure, and a thickness of a first pair of layers in the repeating pairs of layers of the superlattice structure is different than a thickness of a second pair of layers. In some cases, the semiconductor structure according to claim 15, wherein the thicknesses of the repeating pairs of layers in the superlattice structure is randomized.

In some cases, the epitaxial layers include a superlattice structure, the superlattice structure comprises repeating pairs of layers, each pair of layers in the repeating pairs of layers comprises a first layer of semiconductor material and a second layer of semiconductor material, and a ratio of a thickness of the first layer of semiconductor material layer to a thickness of the second layer of semiconductor material layer is different among at least two pairs of layers in the repeating pairs of layers of the superlattice structure. The ratio can be randomized among the repeating pairs of layers in the superlattice structure.

In some cases, the first layer of semiconductor material includes a layer of aluminum nitride (AlN) and the second layer of semiconductor material layer includes a layer of gallium nitride (GaN). At least one of the first layer of semiconductor material and the second layer of semiconductor material among the repeating pairs of layers in the superlattice structure can be doped to form a conductive film. In some cases, a plurality of the first layers of semiconductor material among the repeating pairs of layers in the superlattice structure are doped to form a conductive film. The plurality of the first layers of semiconductor material can be periodic throughout the superlattice structure. The plurality of the first layers of semiconductor material can be aperiodic throughout the superlattice structure. In some cases, doping concentrations among the plurality of the first layers of semiconductor material are randomized throughout the superlattice structure. The doping concentrations among the plurality of the first layers of semiconductor material periodically can vary throughout the superlattice structure.

In some cases, a plurality of the second layers of semiconductor material among the repeating pairs of layers in the superlattice structure are doped to form a conductive film. The plurality of the second layers of semiconductor material can be periodic throughout the superlattice structure. The plurality of the second layers of semiconductor material can be aperiodic throughout the superlattice structure. Doping concentrations among the plurality of the second layers of semiconductor material can be randomized throughout the superlattice structure. Doping concentrations among the plurality of the second layers of semiconductor material can periodically vary throughout the superlattice structure.

In some cases, the epitaxial layers include a second superlattice structure. The second superlattice structure includes repeating pairs of layers. Each pair of layers in the repeating pairs of layers includes a first layer of semiconductor material and a second layer of semiconductor material, a ratio of a thickness of the first layer of semiconductor material layer to a thickness of the second layer of semiconductor material layer is constant in the second superlattice structure, and a thickness of a first pair of layers in the repeating pairs of layers of the second superlattice structure is different than a thickness of a second pair of layers.

In some cases, the second superlattice structure includes repeating groups of more than two layers, each group of layers in the repeating groups of layers includes a first layer of semiconductor material, a second layer of semiconductor material, and a third layer of semiconductor material, a ratio of a thickness of the first, second, and third layers of semiconductor material is constant in the second superlattice structure, and a thickness of a first group of layers in the repeating groups of layers of the second superlattice structure is different than a thickness of a second group of layers.

In some cases, the epitaxial layers include a second superlattice structure, the second superlattice structure includes repeating pairs of layers, each pair of layers in the repeating pairs of layers includes a first layer of semiconductor material and a second layer of semiconductor material, and a ratio of a thickness of the first layer of semiconductor material layer to a thickness of the second layer of semiconductor material layer is different among at least two pairs of layers in the repeating pairs of layers of the second superlattice structure.

In some cases, the epitaxial layers include a second superlattice structure, the second superlattice structure includes repeating groups of more than two layers, each group of layers in the repeating groups of layers includes a first layer of semiconductor material, a second layer of semiconductor material, and a third layer of semiconductor material, and a ratio of a thickness of the first, second, and third layers is different among at least two groups of layers in the repeating groups of layers of the second superlattice structure.

In some cases, the first layer of semiconductor material includes a layer of AlN, the second layer of semiconductor material layer includes a layer of AlGaN, and the third layer of semiconductor material layer includes a layer of gallium nitride (GaN).

In some cases, at least one of the first layer of semiconductor material, the second layer of semiconductor material, and the third layer of semiconductor material among the repeating groups of layers in the second superlattice structure is doped to form a conductive film. In other cases, a plurality of the layers of semiconductor material among the repeating pairs of layers in the second superlattice structure can be doped to form a conductive film. The plurality of the layers of semiconductor material can be periodic throughout the second superlattice structure. The plurality of the layers of semiconductor material are aperiodic throughout the second superlattice structure. Doping concentrations among the plurality of the layers of semiconductor material can be randomized throughout the second superlattice structure. Doping concentrations among the plurality of the layers of semiconductor material periodically can vary throughout the superlattice structure.

In another example, a semiconductor structure includes a substrate formed from a first base semiconductor material, and a number of epitaxial layers formed over the substrate from a second base semiconductor material, the number of epitaxial layers include a superlattice structure and a conduction layer formed over the superlattice structure. The superlattice structure includes repeating pairs of layers, each pair of layers in the repeating pairs of layers includes a first layer of semiconductor material and a second layer of semiconductor material, a ratio of a thickness of the first layer of semiconductor material layer to a thickness of the second layer of semiconductor material layer is constant in the superlattice structure, and a thickness of a first pair of layers in the repeating pairs of layers of the superlattice structure is different than a thickness of a second pair of layers. The thicknesses of the repeating pairs of layers in the superlattice structure is randomized.

In another example, a semiconductor structure includes a substrate formed from a first base semiconductor material, and a number of epitaxial layers formed over the substrate from a second base semiconductor material, the number of epitaxial layers include a superlattice structure and a conduction layer formed over the superlattice structure. The superlattice structure includes repeating pairs of layers, each pair of layers in the repeating pairs of layers includes a first layer of semiconductor material and a second layer of semiconductor material, and a ratio of a thickness of the first layer of semiconductor material layer to a thickness of the second layer of semiconductor material layer is different among at least two pairs of layers in the repeating pairs of layers of the superlattice structure. The ratio can be randomized among the repeating pairs of layers in the superlattice structure. In some cases, the semiconductor structure can also include a buffer layer, wherein at least a portion of the buffer layer is formed as a resistive layer.

In some cases, the first layer of semiconductor material includes a layer of AlN and the second layer of semiconductor material layer includes a layer of GaN. At least one of the first layer of semiconductor material and the second layer of semiconductor material among the repeating pairs of layers in the superlattice structure can be doped to form a conductive film. A plurality of the first layers of semiconductor material among the repeating pairs of layers in the superlattice structure are doped to form a conductive film. The plurality of the first layers of semiconductor material can be periodic throughout the superlattice structure. The plurality of the first layers of semiconductor material can be aperiodic throughout the superlattice structure. Doping concentrations among the plurality of the first layers of semiconductor material ca be randomized throughout the superlattice structure. Doping concentrations among the plurality of the first layers of semiconductor material can periodically vary throughout the superlattice structure.

In some cases, a plurality of the second layers of semiconductor material among the repeating pairs of layers in the superlattice structure can be doped to form a conductive film. The plurality of the second layers of semiconductor material can be periodic throughout the superlattice structure. The plurality of the second layers of semiconductor material can be aperiodic throughout the superlattice structure. Doping concentrations among the plurality of the second layers of semiconductor material can be randomized throughout the superlattice structure. Doping concentrations among the plurality of the second layers of semiconductor material can periodically vary throughout the superlattice structure.

In some cases, the epitaxial layers include a second superlattice structure. The second superlattice structure includes repeating pairs of layers, each pair of layers in the repeating pairs of layers includes a first layer of semiconductor material and a second layer of semiconductor material, a ratio of a thickness of the first layer of semiconductor material layer to a thickness of the second layer of semiconductor material layer is constant in the second superlattice structure, and a thickness of a first pair of layers in the repeating pairs of layers of the second superlattice structure is different than a thickness of a second pair of layers.

In some cases, the second superlattice structure includes a repeating groups of more than two layers, each group of layers in the repeating groups of layers includes a first layer of semiconductor material, a second layer of semiconductor material, and a third layer of semiconductor material, a ratio of a thickness of the first, second, and third layers of semiconductor material is constant in the second superlattice structure, and a thickness of a first group of layers in the repeating groups of layers of the second superlattice structure is different than a thickness of a second group of layers.

In some cases, the epitaxial layers include a second superlattice structure, the second superlattice structure includes repeating pairs of layers, each pair of layers in the repeating pairs of layers includes a first layer of semiconductor material and a second layer of semiconductor material, and a ratio of a thickness of the first layer of semiconductor material layer to a thickness of the second layer of semiconductor material layer is different among at least two pairs of layers in the repeating pairs of layers of the second superlattice structure.

In some cases, the epitaxial layers includes a second superlattice structure, the second superlattice structure includes repeating groups of more than two layers, each group of layers in the repeating groups of layers includes a first layer of semiconductor material, a second layer of semiconductor material, and a third layer of semiconductor material, and a ratio of a thickness of the first, second, and third layers is different among at least two groups of layers in the repeating groups of layers of the second superlattice structure.

In some cases, the first layer of semiconductor material includes a layer of AlN, the second layer of semiconductor material layer includes a layer of AlGaN, and the third layer of semiconductor material layer includes a layer of GaN.

In some cases, at least one of the first layer of semiconductor material, the second layer of semiconductor material, and the third layer of semiconductor material among the repeating groups of layers in the second superlattice structure is doped to form a conductive film. A plurality of the layers of semiconductor material among the repeating pairs of layers in the second superlattice structure can be doped to form a conductive film. The plurality of the layers of semiconductor material can be periodic throughout the second superlattice structure. The plurality of the layers of semiconductor material can be aperiodic throughout the second superlattice structure. Doping concentrations among the plurality of the layers of semiconductor material can be randomized throughout the second superlattice structure. Doping concentrations among the plurality of the layers of semiconductor material can periodically vary throughout the superlattice structure.

Among the embodiments, a mesa can be formed from the epitaxial layers, and the semiconductor structure can also include a transistor formed on the mesa. The transistor can include a source, a drain, and a gate formed on the mesa. The embodiments can also include an electrically-insulating dielectric material in an area around the mesa.

In some cases, the semiconductor structure can also include a transistor formed in the epitaxial layers. The transistor can include a source, a drain, and a gate, a source contact formed over the source, and a drain contact formed over the drain. The drain contact can be formed to be larger than the source contact. The drain contact can be formed using more metal than the source contact. The drain contact can be formed to be larger than the source contact. The drain contact can be formed from a first metal, the source contact can be formed from a second metal, and the first metal can be denser than the second metal. The first metal can be gold or osmium. The drain contact can include a number of layers of metal. The drain contact can include a first layer of gold or osmium, a second layer of copper, and a third layer of tungsten.

In some cases, the semiconductor structure can include at least one metal shielding layer formed over the transistor. The metal shielding layer can electrically contact the source or the source contact of the transistor. The metal shielding layer can be electrically isolated from the drain and the gate of the transistor. The metal shielding layer can include a first opening for electrical isolation of the metal shielding layer from the drain of the transistor, and the metal shielding layer can include a second opening for electrical isolation of the metal shielding layer from the gate of the transistor. The metal shielding layer can be electrically coupled to a ground plane on a back side of the substrate, using a metal via through the substrate.

In some cases, the semiconductor structure can also include a low-k dielectric material formed over the transistor, and a metal overlay formed over the low-k dielectric material. The metal overlay includes a source metal overlay, a drain metal overlay, and a gate metal overlay. The source metal overlay can be electrically coupled to the metal shielding layer by a first via through the low-k dielectric material, the drain metal overlay can be electrically coupled to the drain contact of the transistor by a second via through the low-k dielectric material, and the gate metal overlay can be electrically coupled to the gate of the transistor by a third via through the low-k dielectric material.

BRIEF DESCRIPTION OF THE DRAWINGS

The present disclosure can be better understood with reference to the following drawings. The drawings are representative and provided as an example to convey the concepts described herein. The features in the drawings are not necessarily drawn to scale, with emphasis instead placed upon illustrating the principles of the examples. Features or aspects in the drawings may be minimized or enlarged to facilitate an understanding of the embodiments. Additionally, the drawings are not illustrated to be exhaustive of all features, and the drawings may not illustrate every element, feature, or structure present in practice. Similarly, one or more of the elements, features, or structures shown in the drawings can be omitted in some cases. Where the drawings relate to semiconductor structures, devices, and circuits, only one structure, device, or circuit may be shown for simplicity. In practice, a large number of devices or circuits can be fabricated across a larger area of a substrate or semiconductor structure. Additionally, any structure or device shown in the drawings can be integrated within a larger circuit. In the drawings, like reference numerals designate like or corresponding, but not necessarily the same, elements throughout the several views.

8

Figure 9:
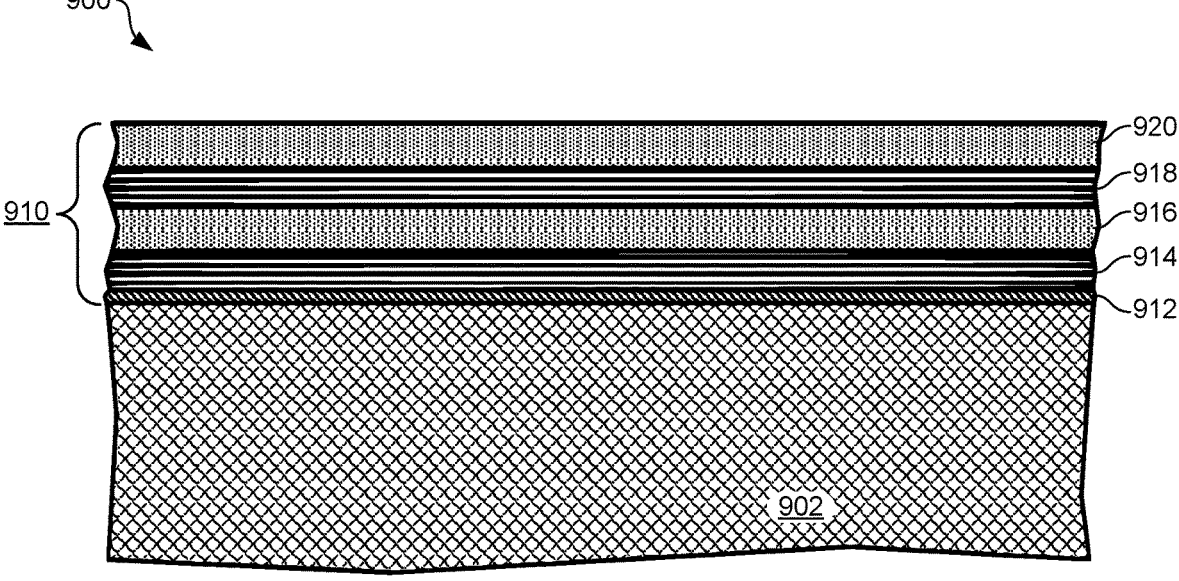

FIG. 9 depicts a multi-superlattice semiconductor structure formed in epitaxial layers on a substrate according to certain aspects of the embodiments.

Figure 10:
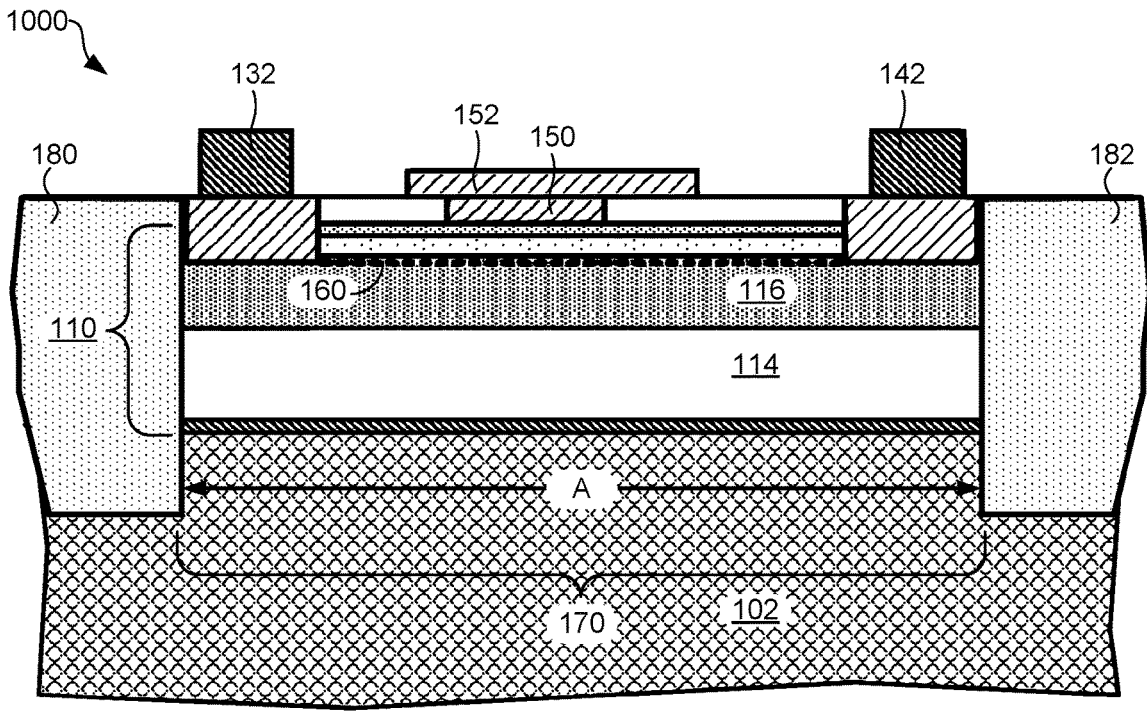

FIG. 10 illustrates an example transistor for suppressing excitation of an acoustic wave according to certain aspects of the embodiments.

Figure 11:
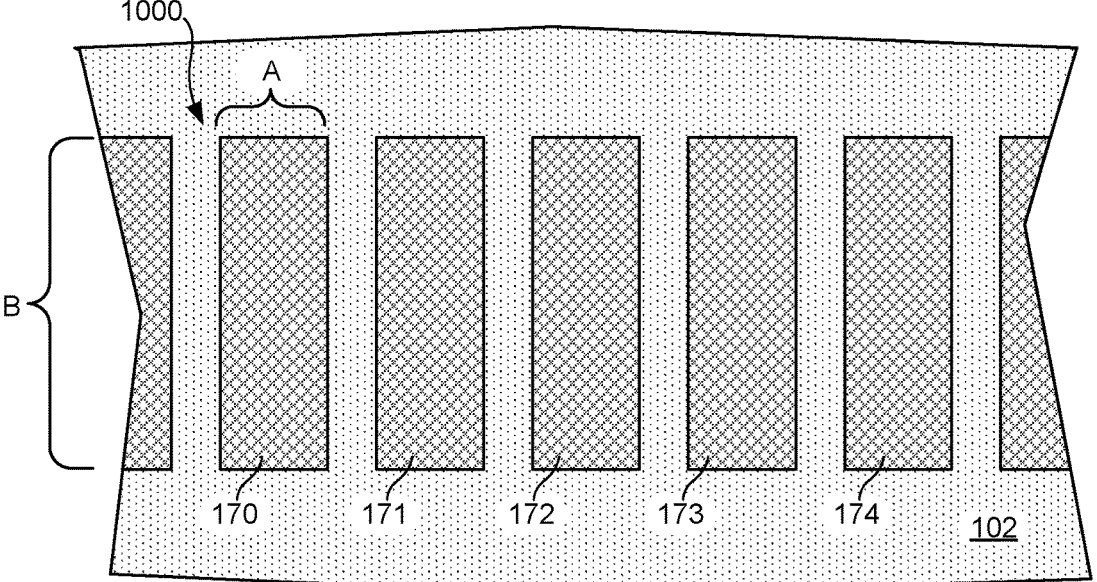

FIG. 11 depicts a top-down view of the structure shown in FIG. 10 for suppressing excitation of an acoustic wave according to certain aspects of the embodiments.

Figure 12:
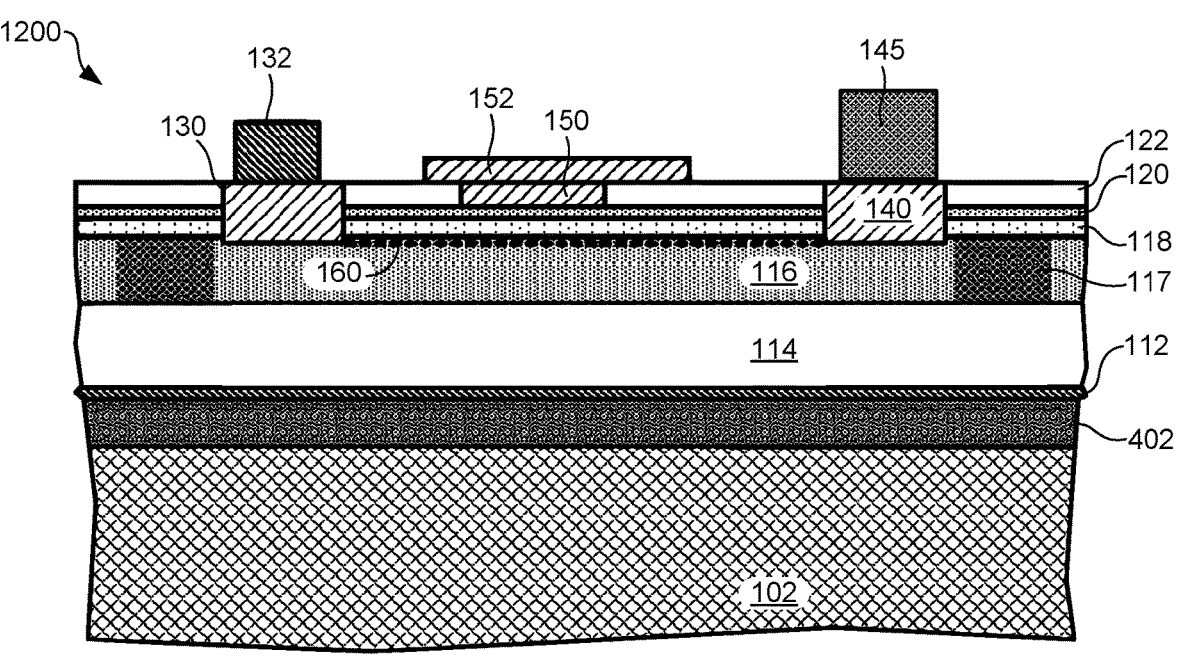

FIG. 12 illustrates an example transistor for suppressing excitation of an acoustic wave using certain metal(s) on the drain contact according to certain aspects of the embodiments.

Figure 13:
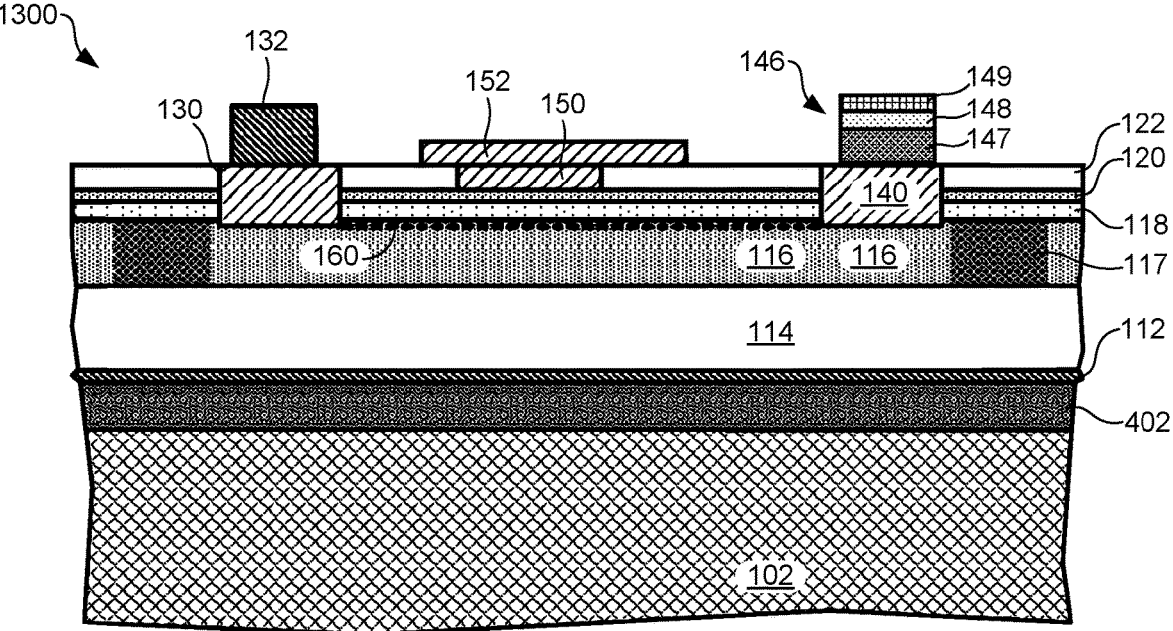

FIG. 13 illustrates an example transistor for suppressing excitation of an acoustic wave using certain metal(s) on the drain contact according to certain aspects of the embodiments.

Figure 14A:
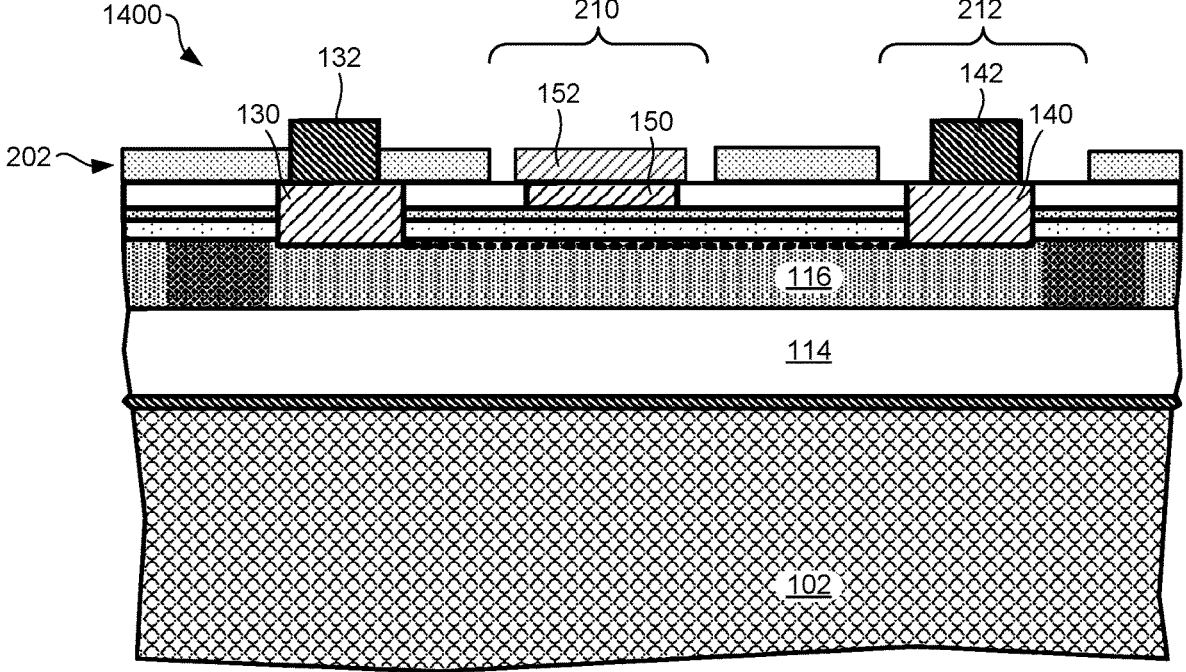

FIG. 14A depicts another example transistor for suppressing excitation of an acoustic wave using metal shielding according to certain aspects of the embodiments.

Figure 14B:

FIG. 14B depicts a perspective view of the example structure shown in FIG. 14A.

Figure 14C:
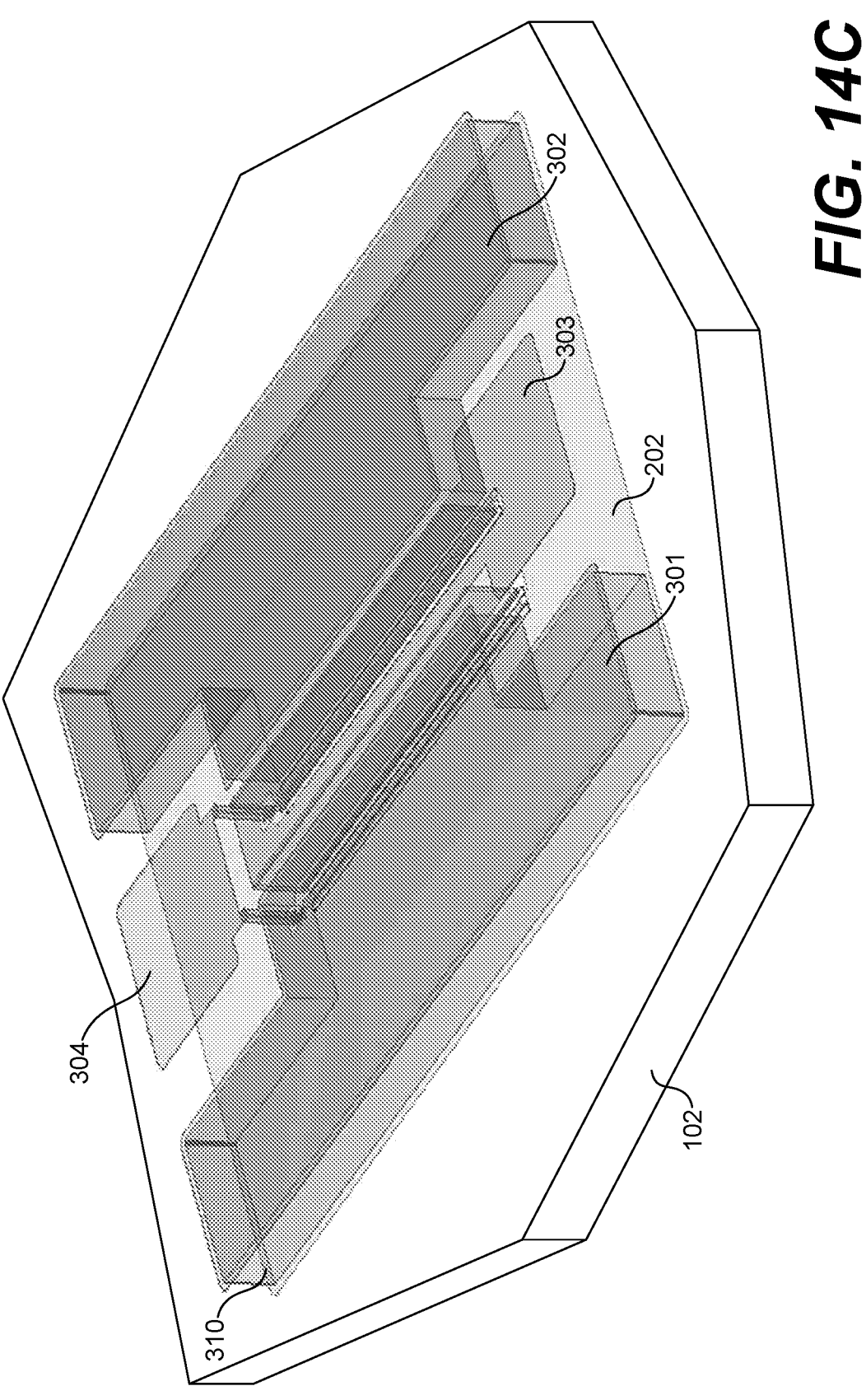

FIG. 14C depicts another example of the structure shown in FIG. 14B.

Features and advantages of the illustrated embodiments will become more apparent from the detailed description set forth below when taken in conjunction with the drawings.

DETAILED DESCRIPTION

In active devices formed on certain semiconductor structures including epitaxial layers of gallium nitride material over substrates of silicon, high temperatures can generate thermal electron-hole pairs in the substrate. The electron-hole pairs can significantly change the conductivity of the substrate. The conductivity of the substrate can vary particularly in a region near features of transistors formed on or in the epitaxial layers, such as in an area of the substrate near an interface with the epitaxial layers. When the substrate is grounded or referenced to the same reference potential used for a bias voltage applied to the drain of a transistor, for example, an appreciable leakage current can leak into the substrate along a conductive path. The leakage current can pass through the epitaxial layers and into the substrate.

In some cases, the leakage current and the accompanying electric field can drive a parasitic acoustic wave in the transistor and the semiconductor structure on which the transistor is formed, particularly in the vicinity of the drain of the transistor. The acoustic wave can exhibit resonant and temperature-dependent behaviors that are undesirable for a number of reasons. In that context, a number of different semiconductor structures for suppressing parasitic acoustic waves are described herein. Some embodiments are directed to spoiling a conductive path that contributes to the generation of acoustic waves. Some embodiments relate to spoiling acoustic characteristics of an acoustic resonant structure that may be present in the semiconductor structures. Combined embodiments that spoil the conductive path and acoustic characteristics are also within the scope of the examples.

Figure 1:
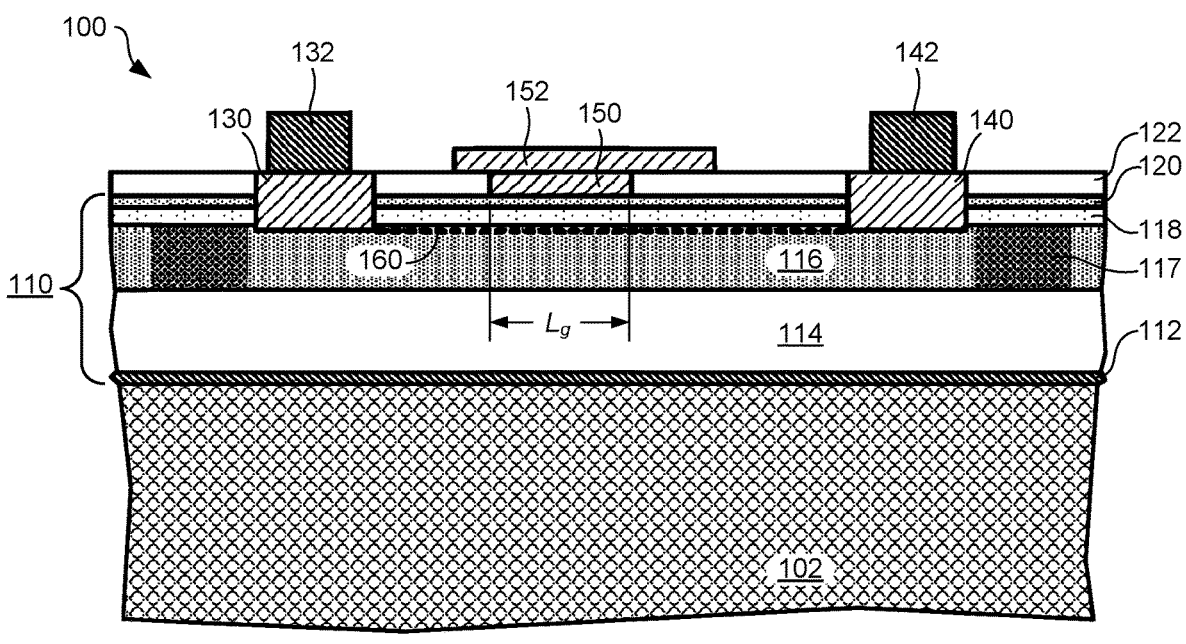
FIG. 1 illustrates an example transistor according to certain aspects of the embodiments.

Turning to the drawings, FIG. 1 illustrates an example transistor 100 according to certain aspects of the embodiments. The transistor 100 is presented as a representative example to discuss certain advantages of the embodiments described herein. The illustration in FIG. 1 is not exhaustive, and the transistor 100 can include other layers, materials, and structural features that are not shown. Additionally, one or more of the layers or features shown in FIG. 1 can be omitted in some cases, and the embodiments also include semiconductor structures without the elements relied upon to form active devices (e.g., embodiments including the epiwafer or the semiconductor layers, without the gate, source, and drain features and contacts). The transistor 100 can be packaged in a suitable semiconductor package, with or without other components.

In one example, the transistor 100 can be embodied as a high-electron-mobility transistor (HEMT), capable of operating with relatively high levels of power and at relatively high frequency signals. HEMTs are field-effect transistors including a heterojunction between two layers or regions of semiconducting materials. The heterojunction substantially confines electrons to a quantum well area. Electrons confined to the heterojunction of a HEMT can exhibit higher mobilities than those in other transistors, such as metal-oxide-semiconductor field-effect transistors (MOSFETs). The transistor 100 can be embodied as lateral HEMT device, and it does not include through-substrate vias, connecting to either the source or the drain of the transistor 100. Thus, the backside of the substrate of the transistor 100 is open or available for heat removal. It can also be easier to integrate lateral HEMT devices into larger integrated circuits (IC), printed circuit boards (PCB), or other circuits or laminates.

The embodiments are not limited to HEMT devices, high-power devices, or high-frequency devices, however. The concepts described herein can be applied to or used with other integrated circuit devices such as, but not limited to, different types of transistors (bipolar junction transistors, metal-oxide-semiconductor transistors, insulated gate bipolar transistors, etc.), diodes, integrated capacitors, integrated inductors, microstrip transmission lines, and other circuit elements.

Referring to FIG. 1, the transistor 100 includes a substrate 102 and a number of layers 110 formed over the substrate 102. In the example shown, the layers 110 can include a transition layer 112, a buffer layer 114, a conduction layer 116, a barrier layer 118, and a cap layer 120. An electrically-insulating dielectric layer 122 is also formed over the cap layer 120. The substrate 102 and layers 110 formed over the substrate 102 can be referred to as an epiwafer or an epiwafer substrate in some cases. An epiwafer can include a number of different layers formed over a base substrate. An epiwafer can include different types or compositions of semiconductor materials in a number of different layers. The respective material compositions of the semiconductor materials, the dopants (either unintentional impurities or intentionally-added dopants) used in the layers, the arrangement of the layers, the thicknesses of the layers, and other material and structural aspects of an epiwafer all contribute to the performance characteristics of transistors and other active devices formed on the epiwafer, including the transistor 100.

The transistor 100 also includes a source 130, a source contact 132, a drain 140, a drain contact 142, a gate 150, and a gate-connected field plate 152. In one example, a length $L_g$ of the gate 150 can be between 0.1 and 3.0 μm, although smaller and larger feature sizes can be relied upon. The width of the gate 150 (measured extending into the page) can be much larger than $L_g$ and selected based on the overall size and power handling capability of the transistor 100. The gate-connected field plate 152 is electrically connected to the gate 150 and extends beyond edges of the gate 150 (i.e., extends further than $L_g$). According to some embodiments, the gate 150 may be formed and located closer to the source 130 than the drain 140, although the gate 150 can be centered between the source 130 and the drain 140 or located closer to the drain 140 in other embodiments. Gate-connected field plates can improve the resistance of a transistor to reverse bias breakdown. In some implementations, an insulating passivation layer (not shown) may be formed over the gate-connected field plate 152, the source contact 132, and the drain contact 142. As shown in FIG. 1, the source 130, drain 140, and the gate 150 are formed on a same side of the substrate 102 (e.g., on a process surface of the substrate 102).

In some implementations, as shown in FIG. 1, isolation regions 117 may be formed around the transistor 100 and other devices to prevent inflow or outflow of leakage current among adjacent devices and/or circuit elements. The isolation regions 117 can surround the transistor 100 in some cases. In one example, the isolation regions 117 can be formed as trench isolation structures (e.g., trenches filled with an oxide or other insulator) formed in the conduction layer 116. In another example, the isolation regions 117 can be formed as damaged crystalline semiconductor areas or regions of the conduction layer 116. Damaged crystalline isolation regions 117 can be formed in the conduction layer 116 by damaging the crystal lattice structure with ion implantation (e.g., implanting nitrogen, argon, boron, or phosphorus) or other suitable approaches. In some embodiments, the isolation regions 117 can be formed around one or more devices by implanting a peripheral region with nitrogen at multiple different energies. The different implantation energies can extend the damaged region around the device from the top of the barrier layer 118 (or cap layer if present) to a depth of at least 100 nm. Forming isolation regions 115 by ion implantation can be easier than process steps associated with forming a field oxide around the device.

Variations on the structure shown in FIG. 1 are described in further detail below. In addition to those variations, it is noted that the structure shown in FIG. 1 is an example. One or more of the layers shown in FIG. 1 can be omitted in some cases. For example, the semiconductor cap layer 120 can be omitted in some cases from the structure shown in FIG. 1. In other cases, a sub-barrier layer can be included below the barrier layer 118, the transition layer 112 can be formed as a number of transition layers, a nucleation layer can be formed below the transition layer 112, and other variations are within the scope of the embodiments.

The substrate 102 can be formed of a first type of semiconductor material, and the buffer layer 114 and the conduction layer 116 can be formed of a second type of semiconductor material. In one example, the substrate 102 can be formed of silicon, and the buffer layer 114 and the conduction layer can be formed of gallium nitride material, such as gallium nitride (GaN). In some cases, the substrate 102 can be doped to have low conductivity, or high resistivity (e.g., in a range between about 3,000 ohm-cm to about 10,000 ohm-cm), so that leakage current through the substrate 102 in a region between the drain 140 and the source 130 is suppressed. In other cases, the substrate 102 can be doped to have high conductivity, or low resistivity (e.g., a resistivity of less than about 0.2 ohm-cm), so that leakage current is capacitively coupled and spread throughout the substrate 102.

Among other layers 110 of gallium nitride material, the buffer layer 114 and the conduction layer 116 can be epitaxially grown on the substrate 102. Such epitaxially-grown heterostructures can be used to reduce the cost of manufacturing devices formed using advanced semiconductor materials, including GaN and other gallium nitride materials. The buffer layer 114 and the conduction layer 116 can be doped as n-type semiconductors, though in some cases, the buffer layer 114 and the conduction layer 116 can be doped as p-type semiconductors.

Because of differences in the crystal structure between the substrate 102 and the conduction layer 116, the transition layer 112, the buffer layer 114, and in some cases a portion of the conduction layer 116, can be formed to reduce defects that would otherwise occur in an upper region of the conduction layer 116, where integrated devices are formed. Example transition layers 112 are described in, for example, U.S. Pat. Nos. 7,135,720 and 9,064,775, which are both incorporated herein by reference in their entirety.

In the transistor 100, the barrier layer 118 and the conduction layer 116 form a heterojunction. The heterojunction results in or forms a two-dimensional electron gas (2DEG) 160 in the conduction layer 116, adjacent to or at the interface between the conduction layer 116 and the barrier layer 118. The 2DEG 160 provides a highly conductive path for current flowing between the source 130 and the drain 140 of the transistor 100. When a voltage potential is applied across the source 130 and the drain 140, the highly conductive path of the 2DEG 160 can be "pinched off" (i.e., closed or substantially closed) or opened by varying a voltage applied at the gate 150. The 2DEG 160 is preferably formed in a region of semiconductor material that has low defect density for a high-performance HEMT.

Although one transistor 100 is depicted in FIG. 1, a number of transistors can be formed on the substrate 102. Several transistors can be electrically coupled together, in parallel, to form a high-power transistor. High-power transistors according to the embodiments can handle hundreds of Watts of power or more. Even a single large transistor 100 may be capable of handling tens of Watts or more. At high power levels, a significant amount of heat is generated by the transistor 100, among other transistors formed over the substrate 102. The heat can conduct through, dissipate into, and significantly heat the substrate 102. The temperature of the substrate 102 can rise significantly in high-power operation, exceed 200° C. and, in some cases, even exceed 300° C. The temperature of the substrate 102 can be the highest over and around features of the transistor 100.

High temperatures can generate thermal electron-hole pairs in the substrate 102, significantly changing the conductivity of the substrate 102. The conductivity of the substrate 102 can vary particularly in a region near certain features of the transistor 100, such as in an area of the substrate 102 near the interface with the transition layer 112, among other locations. When the substrate 102 is grounded or referenced to the same reference potential as used for a bias voltage $V_b$ applied to the drain 140, for example, an appreciable leakage current $I_p$ can leak into the substrate 102 along a conductive path 200. The position of the conductive path 200 is illustrated as a representative example in FIG. 2, as the conductive path 200 is not limited in direction or pathway. The leakage current $I_p$ passes through the epitaxial layers 110 (at least through the conduction layer 116 and the buffer layer 114) and into the substrate 102.

Figure 3A:
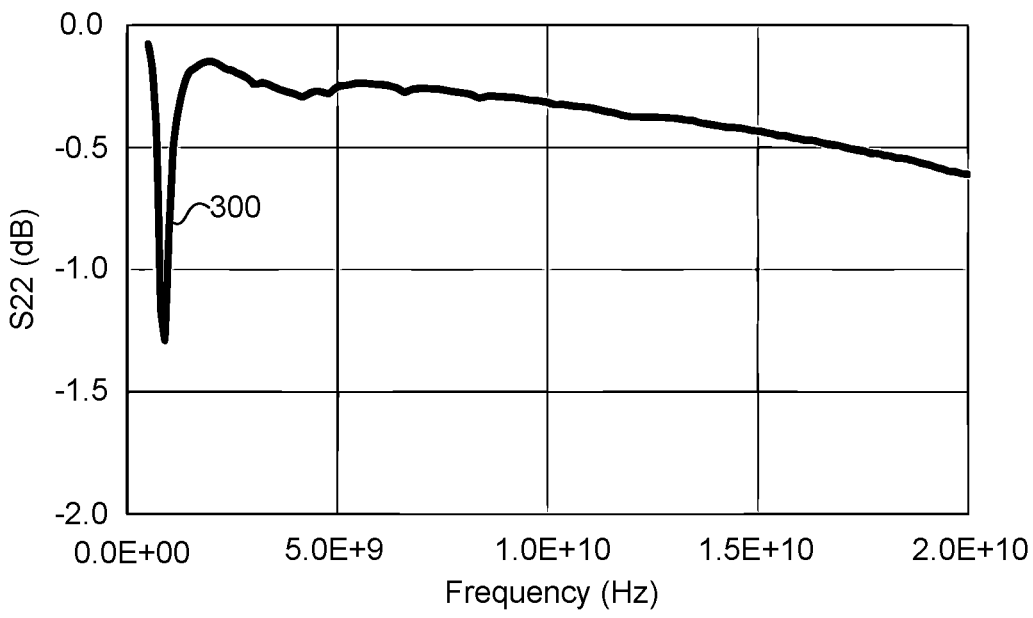
FIG. 3A illustrates an example of the reflected power from a drain contact of the transistor shown in FIG. 1 and a resonance behavior at approximately 1.2 GHz.
Figure 3B:
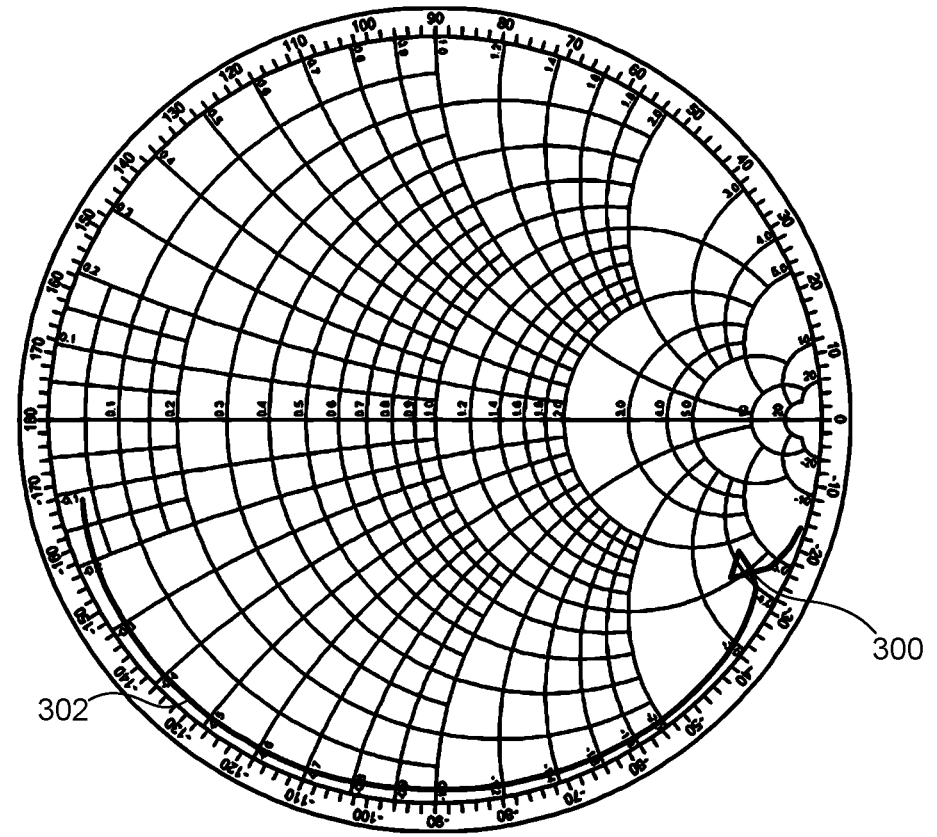
FIG. 3B illustrates the example reflected power measurement shown in FIG. 3A, presented on a Smith chart.

In some cases, the leakage current $I_p$ can drive an acoustic wave in the transistor 100, particularly in the vicinity of the drain 140. The acoustic wave can exhibit resonant and temperature-dependent behaviors. In that context, FIG. 3A illustrates a reflected power $S_{22}$ parameter from the drain 140 of the transistor 100, as a function of frequency for an applied radio-frequency signal, and FIG. 3B illustrates the reflected power measurement shown in FIG. 3A, presented on a Smith chart. For the example shown in FIG. 3A, $V_b$ was 30 volts, the transistor 100 was pinched off by applying a gate bias of −8 volts at the gate 150, and the source 130 was grounded. The plot in FIG. 3A shows a resonance notch 300 at approximately 1.2 GHz. The resonance behavior can also be seen in the Smith chart shown in FIG. 3B, which includes the resonance notch 300 and phase run-out 302 to lower impedance values.

The resonance notch 300 indicates a loss of energy into the layers 110 and substrate 102. This loss of energy can be manifested as reduced performance of the transistor 100. Among other deleterious effects, the loss of energy can be manifested as reduced gain and/or efficiency of the transistor, and is not limited to only HEMT devices. Such loss of energy can adversely affect other types of integrated circuit devices, components, and circuits in which the resonant behavior appears.

Figure 3C:
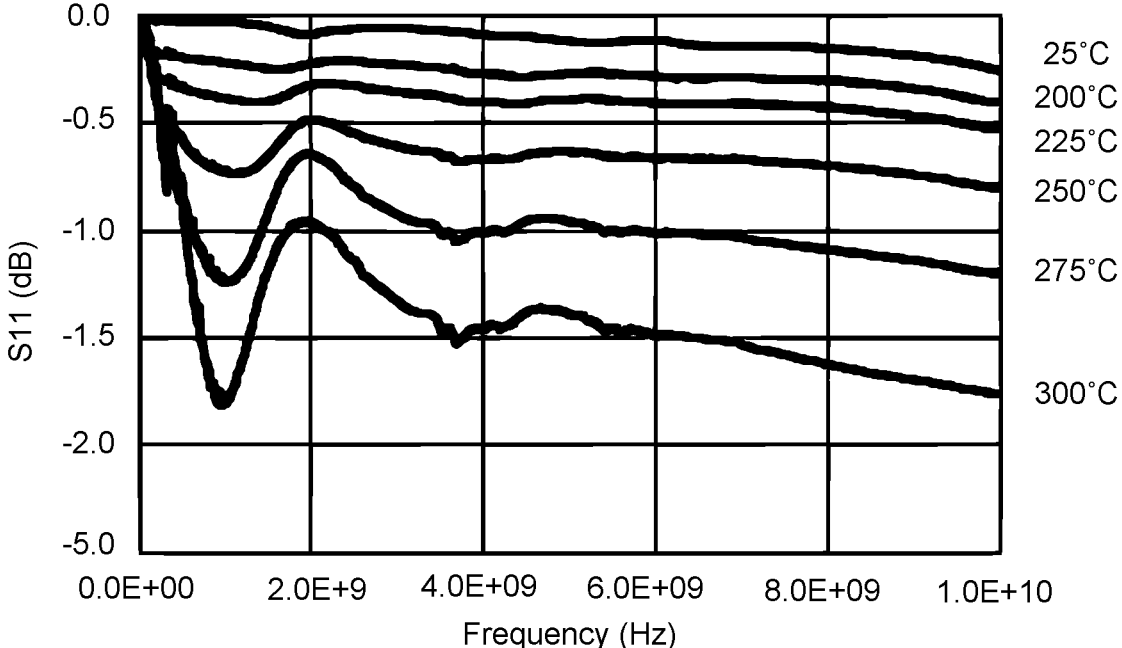
FIG. 3C illustrates an example of the temperature dependence of the resonance behavior attributed to excitation of a bulk acoustic wave in a high-power device.

FIG. 3C illustrates an example of the temperature dependence of the resonance behavior attributed to excitation of a bulk acoustic wave in a high-power device. For the measurements shown in FIG. 3C, an oscillating signal was applied to an insulated metal plate formed on a substrate having layers 110 similar to those shown in FIG. 1. In this case, the insulated metal plate has a structure similar to an integrated capacitor or microstrip transmission line and handles a high-power, high-frequency signal. The reflected power, or Sii parameter, was measured as a function of frequency for six different substrate temperatures. At room and low temperatures, the resonant behavior is not observed, as shown for the 25° C. measurement in FIG. 3C. When the substrate temperature rises above about 200° C., the resonant behavior becomes evident, and a resonant notch and harmonics of the resonant notch can be observed. The resonant notch appears at a frequency of about 1.0 GHz, which does not significantly change with temperature. The lack of change in frequency with temperature suggests that the observed resonant behavior is due to a vertical bulk acoustic wave (BAW).

Some semiconductor materials, such as GaN, are piezoelectric. As a result, the leakage current $I_p$ through the layers 110 and into the substrate 102 can excite a BAW in the transistor 100, among other devices. Effectively, an acoustic resonator is excited by the leakage current $I_p$ passing through the layers 110, due in part to the location of the layers 110 between the drain contact 142 and the substrate 102. The excitement of a BAW can also occur in other types of integrated circuit devices, components, and circuits.

In the context outlined above, a number of approaches to inhibiting the excitation of a BAW or other acoustic wave in the layers 110 and substrate 102 of the transistor 100, among other devices, are described herein. Among others described herein, one approach is to spoil or alter the conductive pathway for the leakage current $I_p$ into the substrate 102. Another approach is to spoil the acoustic resonator structure in the layers 110. Additionally, a combination of the approaches can also be used to inhibit excitation of the BAW or acoustic wave in the epitaxial or other layers of material (s). Further details on these approaches, and others, are described below with reference to certain structural elements and layers in the transistor 100, for example context, in some cases. The concepts described herein are also applicable to other devices beyond the transistor 100 and related HEMT devices, including other integrated circuit devices for high-frequency, high-power signals and other integrated circuit devices, components, and circuits.

Figure 2:
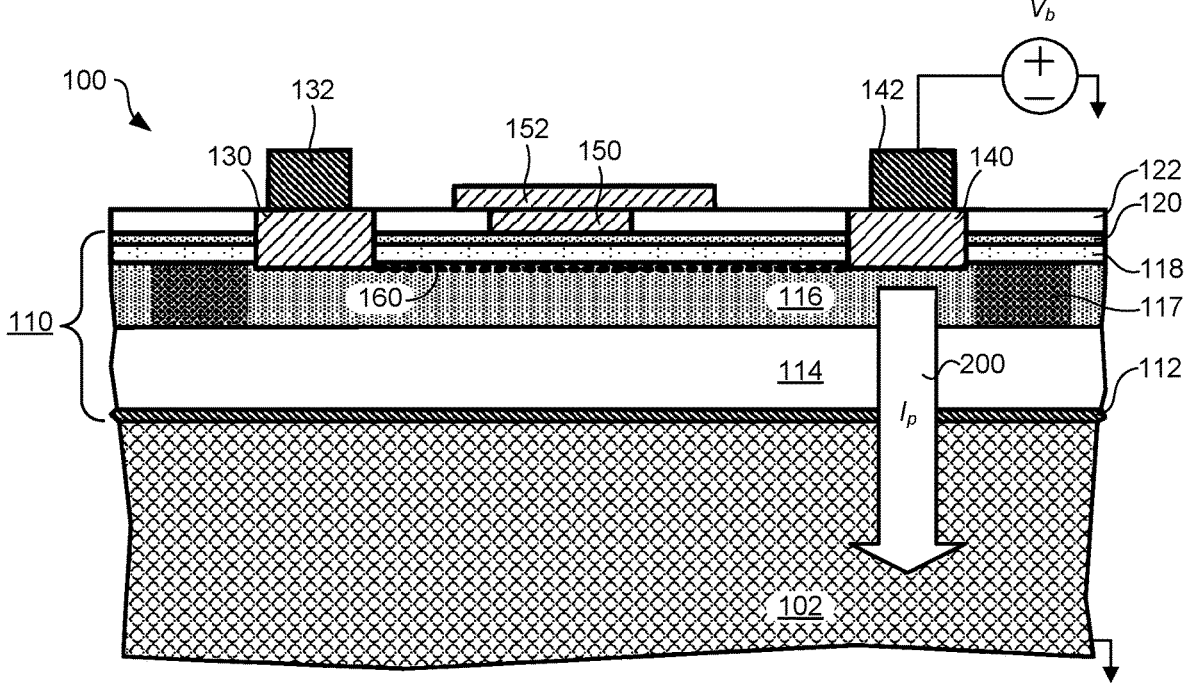
FIG. 2 illustrates an example of leakage current in the transistor shown in FIG. 1.
Figure 4:
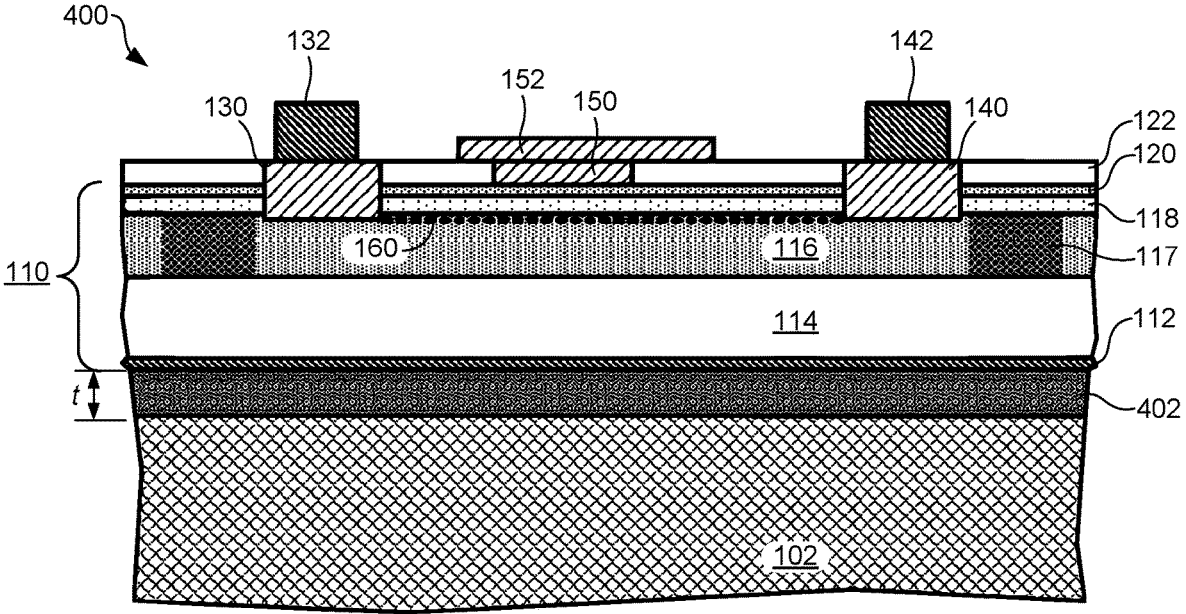
FIG. 4 illustrates an example transistor for suppressing excitation of an acoustic wave according to certain aspects of the embodiments.

One way to inhibit or prevent the excitation of an acoustic wave is to alter or spoil the conductive path 200 shown in FIG. 2. In one approach, the conductive path 200 can be mitigated by changing the structure of the substrate 102 near the interface between the substrate 102 and the transition layer 112. In that context, FIG. 4 illustrates an example transistor 400 for suppressing excitation of an acoustic wave according to certain aspects of the embodiments. In addition to the layers of the transistor 100, the transistor 400 also includes an interface layer 402 formed between the substrate 102 and the transition layer 112. A thickness t of the interface layer 402 can be between 0.5 and 2.0 μm, although the interface layer 402 can be thicker or thinner in other cases. In another example, the transition layer 112 can be omitted from the semiconductor structure shown in FIG. 4. In this case, the interface layer 402 can be formed between the substrate 102 and the buffer layer 114.

Both the substrate 102 and the interface layer 402 can be formed from the same base semiconductor material, such as silicon in one example. The transition layer 112, the buffer layer 114, and the other layers 110 are formed from a different base semiconductor material, such as gallium nitride material. According to one aspect of the embodiments, the interface layer 402 is formed to have an opposite doping type as compared to the transition layer 112, the buffer layer 114, or both. In this case, a diode junction can be formed between the interface layer 402 and the transition layer 112 or between the interface layer 402 and the buffer layer 114. Further, the substrate 102 can be more resistive than intrinsic silicon. The substrate 102 can be formed as a highly resistive substrate in some cases. For example, the substrate 102 can be doped to have high resistivity in a range between 3,000 ohm-cm to 10,000 ohm-cm.

As one example, the interface layer 402 can be embodied as a uniform and highly doped layer of p-type silicon material. In another example, the interface layer 402 can be embodied as a uniform and highly doped layer of n-type silicon material. In general, if the transition layer 112 is doped, the interface layer 402 can be formed to have an opposite doping type as compared to the transition layer 112, so that a diode junction is formed between the interface layer 402 and the transition layer 112. For example, if the transition layer 112 is n-type doped, then the interface layer 402 can be p-type doped. Alternatively, if the transition layer 112 is p-type doped, then the interface layer 402 can be n-type doped. The diode junction between the interface layer 402 and the transition layer 112 can block the leakage current $I_p$ on the half cycle, inhibiting current flow. In still another example, the transition layer 112 can be undoped.

In another example, if the transition layer 112 is omitted and the buffer layer 114 is doped, the interface layer 402 can be formed to have an opposite doping type as compared to the buffer layer 114, so that a diode junction is formed between the interface layer 402 and the buffer layer 114. For example, if the buffer layer 114 is n-type doped, then the interface layer 402 can be p-type doped. Alternatively, if the buffer layer 114 is p-type doped, then the interface layer 402 can be n-type doped. The diode junction between the interface layer 402 and the buffer layer 114 can block the leakage current $I_p$ on the half cycle, inhibiting current flow.

Epitaxial techniques can be relied upon to form or grow a layer of doped silicon as the interface layer 402. If the interface layer 402 is doped to be p-type, then boron, aluminum, or another suitable element may be used as the dopant. Preferably, the p-type doping concentration should be below the elastic limit of the base semiconductor material of the substrate 102 (e.g., of silicon), or distortion of the crystal lattice of the substrate 102 can occur. Such distortion, at excessive doping levels, can convert the surface of the interface layer 402 to a damaged, polycrystalline state, which can cause undesirable distortions and defects in subsequent epitaxial growth of the layers 110 of gallium nitride or other gallium nitride material. The elastic limit in silicon for boron doping is about $3.0\times10^{19}$ cm$^{-3}$. Thus, as examples, the p-type doping concentration in the interface layer 402 can be between $0.5\times10^{19}$ cm$^{-3}$ and $2\times10^{19}$ cm$^{-3}$ and can be uniform throughout the thickness of the interface layer 402 to within 20%.

If the interface layer 402 is doped to be n-type, phosphorus, arsenic, or another suitable element may be used as the dopant. Preferably, the n-type doping concentration should be below the elastic limit of the substrate 102, or distortion of the crystal lattice of the substrate 102 can occur. Such distortion, at excessive doping levels, can convert the surface of the interface layer 402 to a damaged, polycrystalline state, which can cause undesirable distortions and defects in subsequent epitaxial growth of the layers 110 of gallium nitride or other gallium nitride material.

According to other embodiments, the interface layer 402 can have a graded doping profile as a function of depth, with the highest concentration of doping being at or near an interface between the interface layer 402 and the transition layer 112. A graded doping profile in the interface layer 402 can eliminate an abrupt interface between the transition layer 112 and the substrate 102. The graded doping profile can spread the vertical voltage excitation over a graded, resistive region. The graded resistive nature of this region can attenuate, disrupt, and suppress excitation of the acoustic wave.

The interface layer 402 can have a p-type graded doping profile as a function of depth. In this case, the highest dopant concentration in the interface layer 402 can be between $0.5\times10^{19}$ cm$^{-3}$ and $2\times10^{19}$ cm$^{-3}$. Preferably, the doping concentration should be below the elastic limit of the substrate 102 as described above. Alternatively, the interface layer 402 can have an n-type graded doping profile as a function of depth. In this case, the highest dopant concentration in the interface layer 402 can be between $0.5\times10^{19}$ cm$^{-3}$ and $2\times10^{19}$ cm$^{-3}$.

Ion implantation followed by a redistributing thermal drive can be relied upon to form a graded doping profile in the interface layer 402, as one example. This approach can produce an error function, Gaussian, or Pearson distribution of dopants in the substrate 102. Alternate doping techniques include the use of ultra-high vacuum chemical-vapor deposition (UHVCVD) or metal-organic chemical-vapor deposition (MOCVD) process steps to grow the interface layer 402. In either CVD case, the doped region may be produced at temperatures below 600° C., and the graded junction can be produced by varying the dopant concentration in the carrier gas stream during the epitaxial growth. While it is possible to produce a desired graded doping profile in the interface layer 402 by epitaxial growth, in some cases the high growth temperatures can overdrive the junction depth and may undesirably reduce the surface dopant concentration.

With any approach to form a graded doping profile in the interface layer 402, the peak dopant concentration throughout the interface layer 402 should remain below the elastic limit of the specific doping specie being employed, as described above. For example, if boron is used to form a graded p-type interface layer 402, the peak dopant concentration should preferably not exceed approximately $2\times10^{19}$ cm$^{-3}$ and should not exceed $3\times10^{19}$ cm$^{-3}$.

Figure 5:
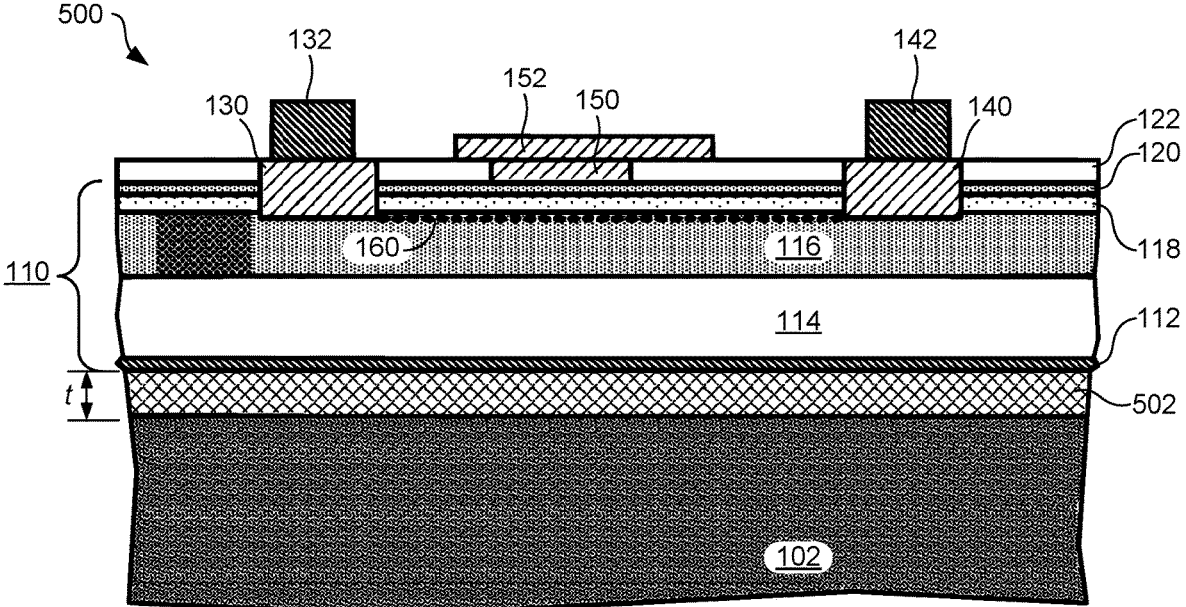
FIG. 5 illustrates another example transistor for suppressing excitation of an acoustic wave according to certain aspects of the embodiments.

FIG. 5 illustrates another example transistor 500 for suppressing excitation of an acoustic wave according to certain aspects of the embodiments. The transistor 500 is presented as a representative example to discuss certain advantages of the embodiments described herein. The illustration in FIG. 5 is not exhaustive, and the transistor 500 can include other layers, materials, and structural features that are not shown. Additionally, one or more of the layers or elements shown in FIG. 5 can be omitted in some cases. The transistor 500 can be packaged in a suitable semiconductor package, with or without other components.

As shown in FIG. 5, the transistors 500 includes an interface layer 502 formed between the substrate 102 and the transition layer 112. The substrate 102 in the transistor 500 is embodied as a highly conductive silicon substrate, and the interface layer 502 is embodied as a highly resistive layer of silicon. The substrate 102, or at least one region of the substrate 102, can be doped to have a resistivity of less than about 0.2 ohm-cm, for example, to form a highly conductive substrate 102 or a highly conductive region in the substrate 102. In some cases, the resistivity of the substrate 102 can be less than about 0.02 ohm-cm.

The substrate 102 can be n-type or p-type doped for conductivity. In one example, the substrate 102 is doped using an opposite conductivity type as compared to the transition layer 112. Thus, if the transition layer 112 is n-type doped, then the substrate 102 can be p-type doped. Alternatively, if the transition layer 112 is p-type doped, then the substrate 102 can be n-type doped.

The interface layer 502 can have a resistivity of between 3,000 ohm-cm and 10,000 ohm-cm. A thickness t of the interface layer 502 can be between 0.5 and 4 μm, although the interface layer 502 can be thicker or thinner in other cases. The interface layer 502 can be formed by epitaxial growth of undoped silicon on or over the highly doped, conductive substrate 102. The interface layer 502 can include a graded doped region, extending from the substrate 102 into the grown interface layer 502 due to diffusion from the substrate 102 during epitaxial growth.

In an alternative fabrication method, wafer bonding can be used to add the interface layer 502 (or the interface layer 402 shown in FIG. 4) on or over the substrate 102, to mitigate and reduce dopant diffusion into the interface layer 502. To add the interface layer 502 in this way, a highly resistive wafer can be bonded (e.g., via Van der Waal forces and a subsequent heating process) over the substrate 102. The thickness of the highly-resistive wafer can then be reduced to a desired thickness (e.g., between 0.5 and 4 μm) by employing chemical/mechanical grinding and polishing techniques, to arrive at the interface layer 502.

Because it is highly conductive, the substrate 102 can capacitively couple, through the interface layer 502, to the device formed in the layers 110 of the transistor 500, so that leakage current flows laterally through the highly conductive substrate 102, with less loss and heating. The reduced loss and heating with this approach can help to avoid high temperatures in the substrate 102 and the interface layer 502, above which increased conductivity may lead to excitation of an acoustic wave.

Another way to inhibit or prevent the excitation of a BAW is to alter or spoil the vertical acoustic resonator formed between the substrate and metal contacts in an active device. Several different approaches can be relied upon to degrade or mitigate the vertical acoustic resonator by changing the structure near an interface between the substrate and the buffer layer.

Figure 6:
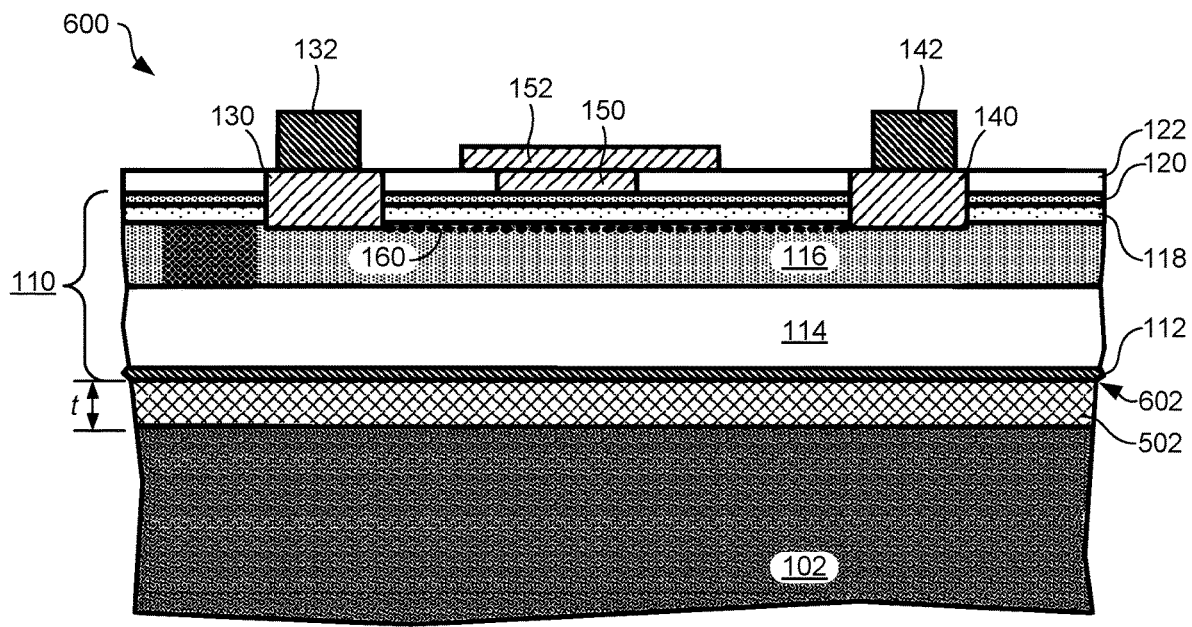
FIG. 6 illustrates an example transistor for altering a vertical acoustic resonator according to certain aspects of the embodiments.

FIG. 6 illustrates an example transistor 600 for altering a vertical acoustic resonator and a BAW according to certain aspects of the embodiments. The transistor 600 is similar in structure to the transistor 100 shown in FIG. 1, the transistor 400 shown in FIG. 4, and the transistor 500 shown in FIG.

5, but also includes a superlattice near an interface 602 between the interface layer 502 and the transition layer 112. The superlattice is described in greater detail below with reference to FIG. 7. The transistor 600 is presented as a representative example to discuss certain advantages of the embodiments described herein. The illustration in FIG. 6 is not exhaustive, and the transistor 600 can include other layers, materials, and structural features that are not shown. Additionally, one or more of the layers or elements shown in FIG. 6 can be omitted in some cases. As one example, the semiconductor cap layer 120 can be omitted in some cases from the structure shown in FIG. 6. As another example, the interface layer 502 can be omitted in some cases. If the interface layer 502 is omitted, then the interface 602 can exist between the substrate 102 and the transition layer 112. The embodiments also include semiconductor structures without the elements relied upon to form active devices (e.g., embodiments including the semiconductor layers, without the gate, source, and drain features and contacts). The superlattice in the transistor 600 can be formed to degrade the vertical acoustic resonator in the transistor 600.

Figure 7:
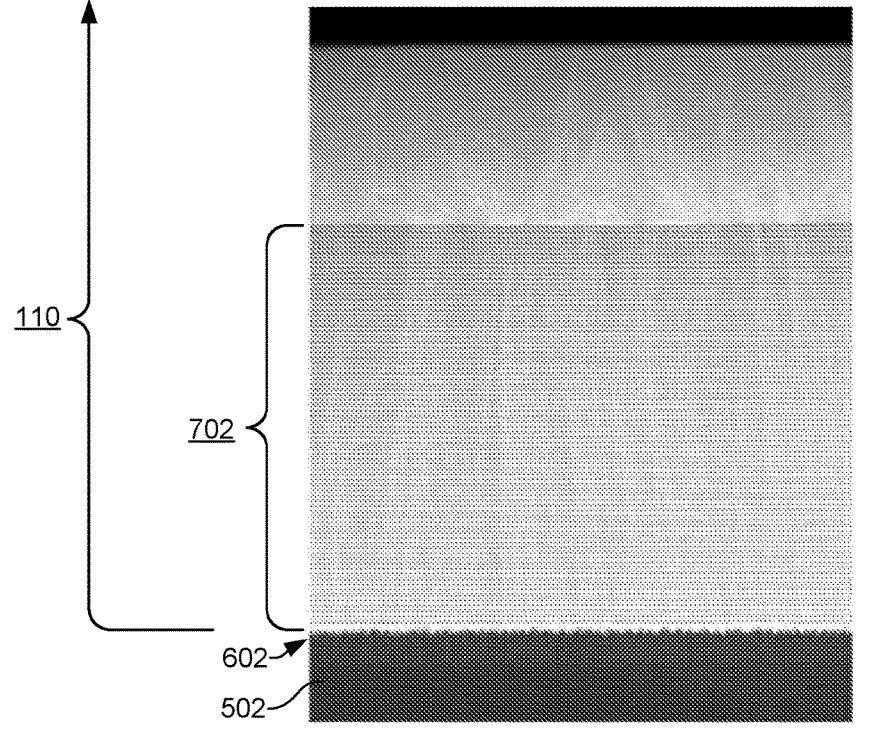
FIG. 7 illustrates an example superlattice structure at an interface of a heteroepitaxial region of a wafer according to certain aspects of the embodiments.

FIG. 7 illustrates an example superlattice structure 702 at the interface 602 shown in FIG. 6. The superlattice structure 702 can be embodied as a number of epitaxially-grown layers of gallium nitride material as described in further detail below. The interface 602 is positioned at a heteroepitaxial region of a wafer. The interface 602 exists between a first type of semiconductor material and a second type of semiconductor material in the wafer, such as between silicon and gallium nitride material. For consistency with FIG. 6, the interface 602 is shown between the interface layer 502 and the layers 110 of gallium nitride material. In other examples, however, the interface 602 can be positioned between the substrate 102 and the layers 110 of gallium nitride material if the interface layer 502 is omitted. Only a portion of the layers 110 of gallium nitride material are shown in FIG. 7, as the buffer layer 114 and the conduction layer 116 are not completely grown in the example shown.

Because of lattice mismatch between the first type of semiconductor material (e.g., silicon) and the second type of semiconductor material (e.g., gallium nitride material), in-plane stress can occur, particularly for thick layers of the second type of semiconductor material. In-plane stress can significantly and undesirably bow semiconductor material wafers. Thus, in one aspect, the superlattice structure 702 can be formed to help reduce or avoid such wafer bow. The superlattice structure 702 can include repeating pairs of layers, where each pair of layers in the repeating pairs of layers includes a first layer of semiconductor material and a second layer of semiconductor layer. The first layer of semiconductor material can be a layer of aluminum nitride (AlN) and the second layer of semiconductor material layer can be a layer of GaN. The repeating pairs of AlN and GaN layers can be formed as epitaxial layers using epitaxial growth processes.

Certain features of the superlattice structure 702 can be periodic or vary periodically. Example thicknesses of the alternating AlN and GaN layers can be about 4 nm for the AlN layers (i.e., the darker lines/layers) and about 17 nm for GaN layers (i.e., the lighter lines/layers), for a ratio of about 4:17 (AlN:GaN), although other thicknesses with approximately the same ratio can be used. Other ratios can also be relied upon in some cases. The alternating pairs of AlN and GaN layers can be repeated, periodically with the same size ratio, between 80 to 190 times or more in the superlattice structure 702 depending on the total thickness of the layers 110. Since the sign or type of stress (e.g., compressive or tensile) reverses in the individual AlN and GaN layers, a ratio of layer thickness can be chosen to cancel or reduce in-plane stresses accumulating for all epitaxial layers in the superlattice structure 702, to help maintain wafer flatness and avoid wafer bow.

In other aspects, the superlattice structure 702 can be formed to reduce capacitive coupling between a device formed over the layers 110 and the substrate 102, to avoid the vertical acoustic resonator and a BAW. A total thickness of the superlattice structure 702, total thickness of the layers 110, or both can be reduced or increased, to alter the resonance frequency of the vertical acoustic resonator. In that way, the resonance frequency can be moved to outside a frequency band in which RF signals will be amplified.

In a different approach to reduce capacitive coupling, certain features of the superlattice structure 702 can be aperiodic or randomized. The layers in the superlattice structure 702 can be formed in an aperiodic fashion to avoid resonant behavior that could arise from the periodicity of layers in the superlattice structure 702. The thicknesses of the pairs of layers in the superlattice structure 702 can be varied or randomized, for example, to suppress the vertical acoustic resonator and the resonant frequency of the BAW.

A ratio of the thickness of the first layer of semiconductor material layer to the thickness of the second layer of semiconductor material layer can be constant in each pair of layers in the superlattice structure 702. However, the thicknesses of the pairs of layers in the superlattice structure 702 can vary as compared to each other. The thicknesses of each pair of AlN and GaN layers, respectively, can be different or random as compared to each other pair of AlN and GaN layers, while maintaining a constant layer thickness ratio (e.g., ~4:17) between the AlN and GaN layers.

In one example, the superlattice structure 702 can include a first pair of AlN and GaN layers having a layer thickness ratio of 4:17, followed by a second pair of AlN and GaN layers having a layer thickness ratio of 8:34, followed by a third pair of AlN and GaN layers having a layer thickness ratio of 5:21.25, followed by a fourth pair of AlN and GaN layers having a layer thickness ratio of 7:29.75, followed by a fifth pair of AlN and GaN layers having a layer thickness ratio of 8:34, and so on. In this example, the pairs of AlN and GaN layers having respective layer thickness ratios are not repeated in any sequence. While the same layer thickness ratio could repeat itself in the superlattice structure 702, the same ratio will not be repeated in a sequence, and the thicknesses of the pairs of layers in the superlattice structure 702 are formed in an aperiodic or randomized fashion.

In another example, a ratio of the thickness of the first layer of semiconductor material layer to the thickness of the second layer of semiconductor material layer is different for at least two pairs of layers in the repeating pairs of layers of the superlattice structure 702. The thicknesses of each AlN and GaN layer in each layer pair may be different or random as compared to each other, without maintaining a constant layer thickness ratio (i.e., randomizing the thickness ratio) between the pairs of AlN and GaN layers. For example, the superlattice structure 702 can include a layer thickness ratio of 5:17 for a first pair of AlN and GaN layers, followed by a layer thickness ratio of 8:30 for a second pair of AlN to GaN layers, followed by a layer thickness ratio of 7:20 for a third pair of AlN to GaN layers, followed by a layer thickness ratio of 4:15 for a fourth pair of AlN to GaN layers, followed by a layer thickness ratio of 9:12 for a fifth pair of AlN to GaN layers, and so on. In this example, the thickness ratio among the AlN and GaN layers is not constant (i.e., the thickness ratio is aperiodic or randomized) and the thickness ratios used are also not repeated in any sequence. While the same layer thickness ratio could repeat itself in the superlattice structure 702, the same ratio will not be repeated in a sequence, and the thicknesses of the layers in the superlattice structure 702 are formed in an aperiodic or randomized fashion.

The conductivity of certain layers of the superlattice structure 702 can be increased in some cases. For example, a number of individual GaN layers in the superlattice structure 702 can be doped to form one or more conductive films by adding an appropriate concentration of dopant during the growth of the GaN layers. A p-type or n-type dopant can be used in any of the examples described herein. A conductive GaN layer can be formed at about every 50 nm, 100 nm, 150 nm, 200 nm, 250 nm, 300 nm, 350 nm, or 400 nm throughout the superlattice structure 702, although other spacings can be relied upon. The conductive layers can help to dampen the BAW effect by terminating the vertical driving voltage. In other cases, the presence of one or more conductive layers in a top portion of the superlattice structure 702 can shorten a length of the resonant acoustic cavity and increase the resonant frequency and/or disrupt the resonant excitation. The location of the conductive layers within the superlattice can be periodic, aperiodic, or randomized. In some cases, every GaN layer can be doped.

In another example, a number of individual AlN layers in the superlattice structure 702 can be doped to form one or more conductive films by adding an appropriate concentration of dopant during the growth of the AiN layers. A p-type or n-type dopant can be used in any of the examples described herein. A conductive AlN layer can be formed at about every 50 nm, 100 nm, 150 nm, 200 nm, 250 nm, 300 nm, 350 nm, or 400 nm throughout the superlattice structure 702, although other spacings can be relied upon. The conductive AlN layers can help to dampen the BAW effect by terminating the vertical driving voltage. In other cases, the presence of one or more conductive layers in a top portion of the superlattice structure 702 can shorten a length of the resonant acoustic cavity and increase the resonant frequency and/or disrupt the resonant excitation. The location of the conductive layers within the superlattice can be periodic, aperiodic, or randomized. In some cases, every AlN layer can be doped.

A doping concentration for at least a portion of the GaN layers in the superlattice structure 702 can be between $1.0 \times 10^{16}$ cm$^{-3}$ and $2.0 \times 10^{18}$ cm$^{-3}$. As one example, a p-type doping concentration of a number of the GaN layers can be about $1.0 \times 10^{16}$ cm$^{-3}$. In another example, the p-type doping concentration of the GaN layers can be about $2.0 \times 10^{18}$ cm$^{-3}$. The doping concentrations can have certain tradeoffs. Higher doping concentrations may lead to metal-like behavior of the conductive layers and adversely increase capacitive coupling between any active devices formed on the epitaxial layers 710 and the conductive layer(s) in the superlattice structure 702. Low dopant concentrations may cause the superlattice structure 702 to behave more like an undoped structure with little suppression of a BAW. Thus, the doping concentration of the GaN layers can also be more central in the range from $1.0 \times 10^{16}$ cm$^{-3}$ to $2.0 \times 10^{18}$ cm$^{-3}$, such as about $1.0 \times 10^{17}$ cm$^{-3}$.

In other cases, the doping concentrations of the GaN layers in the superlattice structure 702 can vary among each other, while the AlN layers are undoped or not intentionally doped. For example, the superlattice structure 702 can include a layer of GaN at a doping concentration of about $1.0 \times 10^{16}$ cm$^{-3}$, followed by one or more undoped layers of GaN, followed by a layer of GaN at a doping concentration of about $1.0 \times 10^{17}$ cm$^{-3}$, followed by one or more undoped layers of GaN, followed by a layer of GaN at a doping concentration of about $1.0 \times 10^{18}$ cm$^{-3}$ (or $2.0 \times 10^{18}$ cm$^{-3}$), and so on. In some cases, a doped layer of GaN can be adding every 200 nm or 300 nm throughout the superlattice structure 702 to help dampen the BAW effect by terminating the vertical driving voltage. In other cases, a conductive GaN layer can be included more frequently than every 200 nm throughout the superlattice structure 702. In some cases, every GaN layer can be doped in the superlattice structure 702. In other embodiments, the doping concentrations of the AlN layers in the superlattice structure 702 can periodically vary, consistent with the examples above, while the GaN layers are undoped or not intentionally doped. In still other embodiments, the doping concentrations of both the GaN layers and the AlN layers in the superlattice structure 702 can vary among each other, consistent with the examples above.

In embodiments with different doping concentrations among the GaN layers in the superlattice structure 702, the variations in the doping concentrations can be periodic. That is, a sequence of different doping concentrations (e.g., a sequence of $1.0 \times 10^{16}$ cm$^{-3}$, $1.0 \times 10^{17}$ cm$^{-3}$, and $2.0 \times 10^{18}$ cm$^{-3}$ doping concentrations) can repeat through the superlattice structure 702 or a portion of the superlattice structure 702. In other embodiments, the doping concentrations among the GaN layers in the superlattice structure 702 can be randomized or aperiodic, such that no repeating sequence of different doping concentrations occurs in the superlattice structure 702.

In embodiments with different doping concentrations among the AlN layers in the superlattice structure 702, the variations in the doping concentrations can be periodic. That is, a sequence of different doping concentrations (e.g., a sequence of $1.0 \times 10^{16}$ cm$^{-3}$, $1.0 \times 10^{17}$ cm$^{-3}$, and $2.0 \times 10^{18}$ cm$^{-3}$ doping concentrations) can periodically vary (e.g., vary, but periodically repeat) through the superlattice structure 702 or a portion of the superlattice structure 702. In other embodiments, the doping concentrations among the AlN layers in the superlattice structure 702 can be randomized or aperiodic, such that no repeating sequence of different doping concentrations occurs in the superlattice structure 702.

In embodiments with different doping concentrations among the GaN layers, the AlN layers, or both the GaN and AlN layers in the superlattice structure 702, the variations in the doping concentrations can be periodic. That is, a sequence of different doping concentrations (e.g., a sequence of $1.0 \times 10^{16}$ cm$^{-3}$, $1.0 \times 10^{17}$ cm$^{-3}$, and $2.0 \times 10^{18}$ cm$^{-3}$ doping concentrations) can repeat through the superlattice structure 702 or a portion of the superlattice structure 702. The changes in the doping concentrations between two adjacent GaN layers can be stepwise (e.g., increasing or decreasing), variable (e.g., variations of increasing and decreasing over numbers of layers), or some combination thereof. The changes can also be gradual (e.g., a relatively smaller variation of ¼ to ½ an order of magnitude), large (e.g., a large variation of an order of magnitude or more), or some combination thereof.

In other embodiments, the doping concentrations among the GaN layers, the AlN layers, or both the GaN and AlN layers in the superlattice structure 702 can be randomized or aperiodic, such that no repeating sequence of different doping concentrations occurs in the superlattice structure 702, either among the GaN layers or the AlN layers. In still other embodiments, the doping concentrations among the GaN layers in the superlattice structure 702 can be different, but periodic, and the doping concentrations among the AlN layers in the superlattice structure 702 can different and randomized or aperiodic. Alternatively, the doping concentrations among the AlN layers in the superlattice structure 702 can be different, but periodic, and the doping concentrations among the GaN layers in the superlattice structure 702 can different and randomized or aperiodic.

Additionally, both the layer thicknesses and doping concentrations of the AlN and GaN layers in the superlattice structure 702 can be varied, in a periodic or aperiodic fashion in combination with each other, according to any of the examples provided above. The superlattice structure 702 is also not limited to layers of AlN and GaN, as other layers of gallium-nitride material, including repeating groups of more than two layers of different materials, can be relied upon in the superlattice structure 702. Layer thickness and doping concentration variations can be applied to any number of different layers of material in the superlattice structure 702, according to a combination of any of the examples provided above.

Figure 8:
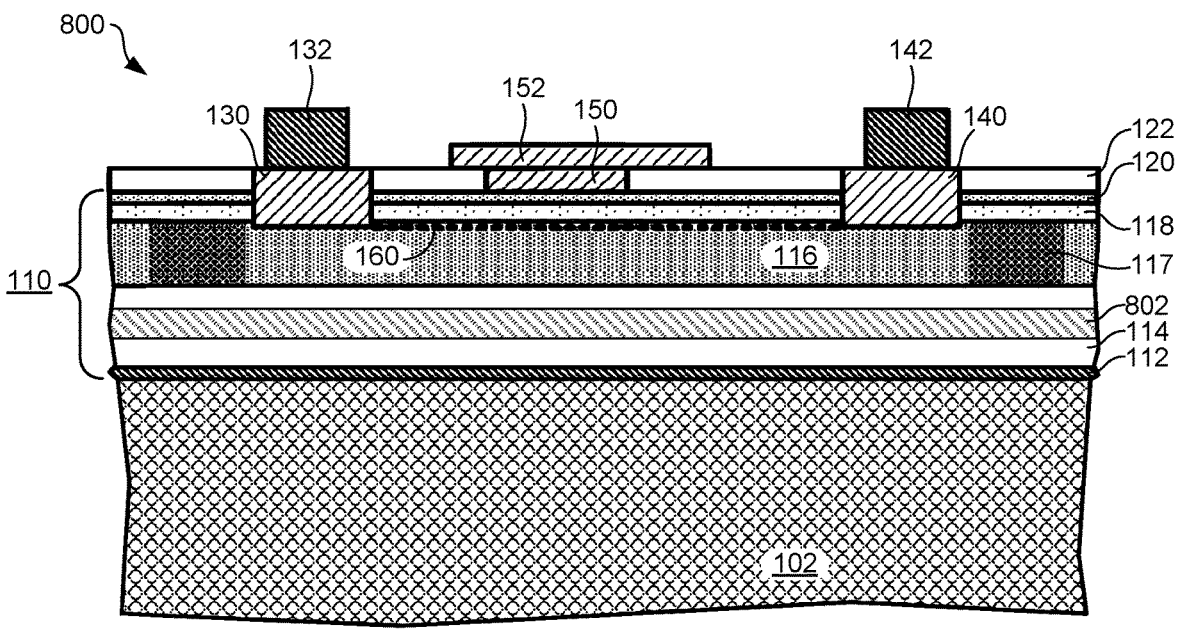
FIG. 8 depicts an example transistor including a resistive layer for suppressing excitation of an acoustic wave according to certain aspects of the embodiments.

Turning to other examples, FIG. 8 depicts an example transistor 800 including a resistive layer 802 for suppressing excitation of an acoustic wave according to certain aspects of the embodiments. In FIG. 8, a portion of the buffer layer 114 has been doped to form the resistive layer 802. A thickness of the resistive layer 802 can be between 0.1 and 3 μm, and a resistivity of the resistive layer 802 can be between 0.01 ohm-cm and 2.0 ohm-cm. The resistive layer 802 can be located anywhere within the buffer layer 114. In some cases, the resistive layer 802 can be p-type doped. Magnesium or zinc can be used as a dopant in that case. A p-type layer within the buffer layer 114 can help to dampen resonant behavior, because the carriers (holes) move slower in the buffer layer 114 of GaN than an acoustic wave. The slow-moving carriers can exert a drag or dampening force on an acoustic wave in the layers 110 and thereby suppress resonant behavior. In some cases, the resistive layer 802 can be n-type doped.

Turning to other examples, FIG. 9 depicts a multi-superlattice semiconductor structure 900 formed in epitaxial layers on a substrate 902. The semiconductor structure 900 is presented as a representative example to discuss certain advantages of the embodiments described herein. The illustration in FIG. 1 is not exhaustive, and the semiconductor structure 900 can include other layers and features that are not shown. Additionally, one or more of the layers or features shown in FIG. 1 can be omitted in some cases The semiconductor structure 900 includes a substrate 902 and a number of layers 910 formed over the substrate 902 using epitaxial growth processes. Among other layers, the layers 910 can include a transition layer 912, a first superlattice structure 914, a first layer 916 of gallium nitride material, a second superlattice structure 918, and a second layer 920 of gallium nitride material. The substrate 902 and layers 910 formed over the substrate 902 can be referred to as an epiwafer or an epiwafer substrate in some cases. The transition layer 912 can be omitted from the layers 910 in some cases, and one or more additional layers, such as a conduction layer, a barrier layer, and a cap layer, can be added to the layers 910 in other cases. The semiconductor structure 900 can include additional superlattice structures in addition to the superlattice structures 914 and 918 in some cases. Transistors and other active devices can also be formed on the semiconductor structure 900, to provide active devices similar to those discussed above.

The superlattice structure 914 can be similar to the superlattice structure 702 shown in FIG. 6. The superlattice structure 918 can also be similar to the superlattice structure 702 shown in FIG. 6. The superlattice structure 914 can be formed using the same arrangement of layers as compared to the superlattice structure 918, in one case, or the superlattice structure 914 can be formed using a different arrangement of layers as compared to the superlattice structure 918.

The superlattice structure 914 can include repeating pairs of layers, where each pair of layers in the repeating pairs of layers includes a first layer of semiconductor material and a second layer of semiconductor layer. The first layer of semiconductor material can be a layer of AlN, and the second layer of semiconductor material layer can be a layer of GaN. The repeating AlN and GaN layers can be formed as epitaxial layers using epitaxial growth processes as described herein. The first and second repeating layers can be formed from other gallium nitride materials in other cases. The superlattice structure 914 can be similar to (or adopt the same structural features as) any embodiment of the superlattice structure 702 described above.

In another example, the superlattice structure 914 can include repeating groups of three layers, where each group of three layers includes a first layer of semiconductor material, a second layer of semiconductor layer, and a third layer of semiconductor material. The first layer of semiconductor material can be a layer of AlN, the second layer of semiconductor material layer can be a layer of AlGaN, and the third layer of semiconductor material layer can be a layer of GaN. The repeating AlN, AlGaN, and GaN layers can be formed as epitaxial layers using epitaxial growth processes as described herein. The first, second, and third repeating layers can be formed from other gallium nitride materials in other cases.

In one example, the layer of AlN can be about 1 nm thick, the layer of AlGaN can be about 4 nm thick, and the layer of GaN can be about 17 nm thick, for a ratio of about 1:4:17, although other thicknesses and ratios of the individual layers can be used. A thickness of each group of three layers can be between 10 nm and 30 nm, as one example, but other thicknesses can be used. An overall thickness of the superlattice structure 914 can be between 100 nm and 2000 nm, or larger in some cases. Among the groups, each layer of the same material can have a same thickness throughout the superlattice structure 914. In this case, each group of three layers can have a thickness ratio of about 1:4:17 (AlN: AlGaN:GaN), have a total thickness of about 22 nm, and repeat from about 4 to 91 times in the superlattice structure 914.

In other cases, the layers of the same material among the groups in the superlattice structure 914 can have different, but repeating thicknesses. In still other cases, the layers of the same material among the groups in the superlattice structure 914 can have different thicknesses, without repeating. In either of these cases, each group of three layers can have a thickness ratio other than 1:4:17 in the superlattice structure 914. The thickness ratios of each group of three layers in the superlattice structure 914 can vary as compared to each other in any of the ways described here, including in a periodic sequence or randomly.

Similar to the superlattice structure 914, the superlattice structure 918 can include repeating pairs of layers, where each pair of layers in the repeating pairs of layers includes a first layer of semiconductor material and a second layer of semiconductor layer. The first layer of semiconductor material can be a layer of AlN, and the second layer of semiconductor material layer can be a layer of GaN. The repeating AlN and GaN layers can be formed as epitaxial layers using epitaxial growth processes as described herein. The first and second repeating layers can be formed from other gallium nitride materials in other cases. The superlattice structure 918 can be similar to (or adopt the same structural features as) any embodiment of the superlattice structure 702 described above.

In another example, the superlattice structure 918 can include repeating groups of three layers, where each group of three layers includes a first layer of semiconductor material, a second layer of semiconductor layer, and a third layer of semiconductor material. The first layer of semiconductor material can be a layer of AlN, the second layer of semiconductor material layer can be a layer of AlGaN, and the third layer of semiconductor material layer can be a layer of GaN. The repeating AlN, AlGaN, and GaN layers can be formed as epitaxial layers using epitaxial growth processes as described herein. The first, second, and third repeating layers can be formed from other gallium nitride materials in other cases.

In one example, the layer of AlN can be about 1 nm thick, the layer of AlGaN can be about 4 nm thick, and the layer of GaN can be about 17 nm thick, for a ratio of about 1:4:17, although other thicknesses and ratios of the individual layers can be used. A thickness of each group of three layers can be between 10 nm and 30 nm, as one example, but other thicknesses can be used. An overall thickness of the superlattice structure 918 can be between 100 nm and 2000 nm, or larger in some cases. Among the groups, each layer of the same material can have a same thickness throughout the superlattice structure 918. In this case, each group of three layers can have a thickness ratio of about 1:4:17 (AlN: AlGaN:GaN), have a total thickness of about 22 nm, and repeat from about 4 to 91 times in the superlattice structure 918.

In other cases, the layers of the same material among the groups in the superlattice structure 918 can have different, but repeating thicknesses. In still other cases, the layers of the same material among the groups in the superlattice structure 918 can have different thicknesses, without repeating. In either of these cases, each group of three layers can have a thickness ratio other than 1:4:17 in the superlattice structure 918.

Although the example shown in FIG. 9 depicts two superlattice structures 914 and 918 in the layers 910, the epitaxial layers 910 can include more than two superlattice structures. The superlattice structures can be separated by additional layers of gallium nitride materials, consistent with the example shown in FIG. 9. In some cases, there can be variations among the superlattice structures 914 and 918 in the layers 910. For example, thicknesses of the individual layers can be different in the superlattice structure 914 as compared to the superlattice structure 918. The total thicknesses of the superlattice structure 914 can be greater or less than the superlattice structure 918.

The first layer 916 of gallium nitride material separates the superlattice structures 914 and 918, as shown in FIG. 9. The first layer 916 of gallium nitride material can include one or more layers of epitaxially grown GaN or other gallium nitride material. In some cases, the first layer 916 of gallium nitride material can consist of fewer than five layers of epitaxially GaN. One or more of the layers may be doped to have n-type or p-type conductivity. In other cases, the layers may be undoped or unintentionally doped. A thickness of the first layer 916 of gallium nitride material can be between 100 nm and 2000 nm, although other sizes can be relied upon.

The second layer 920 of gallium nitride material is formed over the superlattice structure 914. The second layer 920 of gallium nitride material can include one or more layers of epitaxially grown GaN or other gallium nitride material. In some cases, the second layer 920 of gallium nitride material can consist of fewer than five layers of epitaxially GaN. One or more of the layers may be doped to have n-type or p-type conductivity. In other cases, the layers may be undoped or unintentionally doped. A thickness of the second layer 920 of gallium nitride material can be between 100 nm and 2000 nm, although other sizes can be relied upon. The thicknesses of the first and second layers 916 and 920 can be the same or different among the embodiments. The superlattice structures 914 and 918, the variations among the superlattice structures 914 and 918, and other features of the semiconductor structure 900 can provide improved suppression of bulk acoustic waves.

A numerical model was developed to simulate excitation of bulk acoustic waves in structures similar to those shown in FIG. 7 and FIG. 9. For the model, regions including superlattice structures were approximated as a region of uniform material having an acoustic wave velocity of about 8400 meters/second. Regions comprising gallium nitride materials were approximated as a region of uniform GaN having an acoustic wave velocity of about 8000 meters/second. In a first simulation, a signal was applied to a substrate structure similar to that depicted in FIG. 7 and the S(1,1) parameter was measured as a function of frequency. The substrate structure included a single superlattice and a single region of epitaxially grown GaN. The simulation predicted, among other things, a resonance and frequency dip in the S(1,1) parameter at approximately 1.5 GHz.

A device having essentially the same structure as that used in the simulation was manufactured and used to check the simulation results. Actual measurement results of the S(1,1) parameter for the device indicated that the numerical model adequately represents the physical device. For example, the physical device also exhibits a strong frequency dip in the S(1,1) parameter at approximately 1.5 GHz. This dip indicates the loss of energy into the substrate and is believed to be the result of exciting a bulk acoustic wave in the substrate, as described above.

In a second simulation, a signal was applied to the semiconductor structure 900 shown in FIG. 9, but also including three electrodes. A first signal electrode was located between two ground electrodes in the model. The size of each metal electrode was 70 by 100 μm and the nearest edges of the ground electrodes were spaced 80 μm away from the edges of the central, signal electrode. The simulation indicated substantial suppression of the resonance and frequency dip (reduced excitation of a BAW), and indicates a significant reduction in loss of power into the substrate.

In a second simulation, the number of superlattice structures 914 and 918 and layers 916 and 920 of gallium nitride material were increased. The second structure included three superlattice structures (each about 670 nm thick) and three regions comprising epitaxial gallium nitride material (each about 670 nm thick). These results indicated that increasing the number of superlattice structures and regions of gallium nitride material can further reduce loss of power into the substrate due to excitation of a BAW.

Other approaches to inhibiting the excitation of an acoustic wave and a BAW are also within the scope of the embodiments. FIG. 10 illustrates an example transistor 1000 for suppressing excitation of an acoustic wave according to certain aspects of the embodiments. The transistor 1000 in FIG. 10 is similar to the transistor 400 shown in FIG. 4, but the source 130, drain 140, and gate 150 are formed on a mesa 170 or island of the epitaxial layers 110. The size of the mesa 170 in one dimension (i.e., as measured from right to left on the page) is large enough to support the formation of the source 130, drain 140, and gate 150 at typical dimensions for the transistor 1000. The mesa 170 can extend to some extent beyond the lateral edges of the source 130 and the drain 140 among the embodiments, but the mesa 170 is typically closely tailored to the size of the transistor 1000. In one example, the size of the mesa 170 in the dimension shown in FIG. 10 can be in the range of about 7-9 μm based on the dimensions of the transistor 1000, although smaller or larger sizes can be relied upon.

The mesa 170 of the epitaxial layers 110 can be formed by subtractive processing, such as by etching the epitaxial layers 110 away outside of a region in which the source 130, drain 140, and gate 150 are formed. The etched-away, open area(s) in the epitaxial layers 110 around the mesa 170 can be filled with regions 180 and 182 of electrically-insulating dielectric material. In FIG. 10, the epitaxial layers 110 are etched away down to, and to a depth into, the substrate 102. In other embodiments, only a portion of the epitaxial layers 110 are etched away, without extending into the substrate 102.

The mesa 170 can also be tailored in other dimensions, as shown in FIG. 11. FIG. 11 illustrates a top-down view of a number of mesas 170-174, over the substrate 102. As shown in the example of FIG. 11, each of the mesas 170-174 can be formed to the dimensions "A" by "B". The dimension "A" for the mesa 170 of the transistor 1000 is also shown in the cross section in FIG. 10, and the dimension "B" is based on a width of the source 130, drain 140, and gate 150 of the transistor 1000.

FIG. 11 also shows that a number of mesas 171-174 can be formed for other transistors similar to the transistor 1000. For some integrated, high-power devices, thirty (30) to fifty (50) or more devices similar to the transistor 1000 can be formed on the substrate 102 and electrically coupled together as part of a larger integrated amplifier circuit. Thus, 30-50 mesas similar to the mesas 170-174 can be formed, each for an individual amplifier circuit. The use of the mesa or island structures of the epitaxial layers 110, as shown in FIGS. 10 and 11, can help reduce resonant behavior, including that leading to a BAW.

In other embodiments, FIG. 12 illustrates an example transistor 1200 for suppressing excitation of an acoustic wave using certain metal(s) on the drain contact. The transistor 1200 in FIG. 12 is similar to the transistor 400 shown in FIG. 4, but the drain contact 145 has been modified to help reduce resonant behavior, including behavior leading to a BAW. In the transistor 1200, the size and/or material composition of the drain contact 145 has been tailored to reduce resonant behavior. For example, the drain contact 145 can be formed to be larger (e.g., taller, wider, etc.) than the source contact 132 and with more metal than that used to form the source contact 132. The drain contact 145 can also be formed from other, denser, materials than used for the source contact 132 and/or would otherwise be conventionally used. For example, the drain contact 145 can be formed from gold, osmium, or another relatively dense metal, rather than copper used for the source contact 132. The drain contact 145 can consist of gold in one case, consist of osmium in another case, or consist of one relatively dense metal in other cases.

In another variation, FIG. 13 illustrates an example transistor 1300 for suppressing excitation of an acoustic wave using certain metal(s) on the drain contact. The transistor 1300 in FIG. 13 is similar to the transistor 400 shown in FIG.

4, but the drain contact 146 has been modified to help reduce resonant behavior, including behavior leading to a BAW. In the transistor 1300, the drain contact 146 is formed from a number of layers of metal material 147, 148, and 149 to help reduce resonant behavior. The drain contact 146 in the example of FIG. 13 includes three layers of metal material 147, 148, and 149, although more than or less than three layers can be relied upon in other embodiments. The layers can vary in composition or in both composition and thickness. For example, the layer 147 can be relatively thick as compared to the layers 148 and 149. Alternatively, either of the layers 148 or 149 can be relatively thicker as compared to the other layers.

Additionally, different types of metals can be relied upon to form the layers 147-149. In one example, the layer 147 can be formed from gold, osmium, or another relatively dense metal, the layer 148 can be formed from copper, and the layer 149 can be formed from tungsten. In other cases, a relatively malleable metal, such as gold, can be used for the layer 147, and a relatively stiff metal, such as tungsten, can be used for the layer 148. Alternating densities and/or stiffnesses of metals among the layers 147-149 in the drain contact 146 can be relied upon to help reduce resonant behavior.

FIG. 14A depicts another example transistor 1400 for suppressing excitation of an acoustic wave using metal shielding. The transistor 1400 includes a metal shielding layer 202. The metal shielding layer 202 can be formed as a metal layer of about 0.2-0.6 μm in thickness, although other thicknesses can be relied upon. The metal shielding layer 202 can electrically contact the source 130, the source contact 132, or both the source 130 and the source contact 132. However, the metal shielding layer 202 includes an opening or aperture 210 for electrical isolation from the gate 150 and the gate-connected field plate 152. The metal shielding layer 202 also includes an opening or aperture 212 for electrical isolation from the drain 140 and the drain contact 142. Although not shown in FIG. 14A, the metal shielding layer 202 can also be electrically coupled to a ground plane on a back (i.e., bottom) side of the substrate 102, using a metal via through the substrate 102.

FIG. 14B depicts a perspective view of the example structure shown in FIG. 15A. In FIG. 15B, features of a first transistor 1200 and a first transistor 1202 are shown, although not all the structural features of the devices are shown, for simplicity. While the metal shielding layer 202 substantially shields both the transistors 1200 and 1202, it includes openings for the gate, the drain, and the contacts for the gate and the drain of both the transistors 1200 and 1202. As shown in the inset in FIG. 14B, the metal shielding layer 202 includes an opening 210 for electrical isolation of the shielding layer 202 from the gate 150 and the gate-connected field plate 152. The metal shielding layer 202 also includes an opening 212 for electrical isolation of the shielding layer 202 from the drain 140 and the drain contact 142. The openings 210 and 212 are limited to the extent needed for electrical isolation of the gate and drain of the transistors 1200 and 1202, in both lengthwise and widthwise dimensions across the top surface of the structure shown. Although not shown in FIG. 14B, the metal shielding layer 202 can also be electrically coupled to a ground plane on a back (i.e., bottom) side of the substrate 102, using a metal via through the substrate 102.

FIG. 14C depicts another example of the structure shown in FIG. 14B. In FIG. 14C, additional overlay layers for electrical connections to the electrodes of the transistors 1200 and 1202 are shown. Particularly, the first source metal overlay 301, second source metal overlay 302, drain metal overlay 303, and gate metal overlay 304 are shown. The metal overlays 301-304 can be formed over a low-k dielectric material layer (not shown) covering the transistors 1200 and 102. The first source metal overlay 301 is electrically coupled to the metal shielding layer 202 by way of a via 310 through the low-k dielectric material. The second source metal overlay 302 is also electrically coupled to the metal shielding layer 202 by way of a via through the low-k dielectric material. The drain metal overlay 303 is electrically coupled to the drain contacts (e.g., see drain contact 142 in FIG. 14A) of the transistors 1400 and 1402 by way of one or more vias through the low-k dielectric. The gate metal overlay 304 is electrically coupled to the gate contacts (e.g., see gate-connected field plate 152 in FIG. 14A) of the transistors 1200 and 1201 by way of one or more vias through the low-k dielectric. The metal shielding layer 202, metal overlays 301-303, or both can be relied upon to help reduce resonant behavior.

Additional approaches to inhibiting excitation of an acoustic wave may comprise combinations of one or more of the approaches described above. For example, any of the approaches in which the substrate 102 is doped to include a highly conductive region, such as in FIG. 5, can be combined with one or more of the approaches including superlattice structures, such as the superlattice structures 702, 914, or 918 shown in FIGS. 7 and 9. Similarly, any of the approaches in which the substrate 102 is doped to include a highly conductive region, such as in FIG. 5, can be combined with one or more of the approaches shown in FIGS. 10-13 and 14A-14C. Further, the concepts shown and described with respect to FIGS. 10-13 and 14A-14C can be combined with one or more of the approaches including superlattice structures, such as the superlattice structures 702, 914, or 918 shown in FIGS. 7 and 9.

The substrate 102 can be formed of silicon (Si), but the substrate 102 is not limited to being formed from silicon. In other examples, the substrate 102 can be formed from silicon carbide (SiC), silicon germanium (SiGe), gallium arsenide (GaAs), and indium phosphide (InP). According to some embodiments, the substrate 102 may comprise bulk monocrystalline silicon. In some instances, the substrate may comprise a semiconductor on insulator (SOI) substrate where the semiconductor is any of the foregoing mentioned semiconductor substrate materials. The substrate 102 may be in the form of a wafer (e.g., a Si semiconductor wafer) and have a diameter between 50 mm and 450 mm. In various embodiments, the surface of the substrate is monocrystalline, so that a III-nitride (e.g., GaN, AlN, AlGaN, InGaN) or any other suitable crystalline material, such as III-V, II-VI, tertiary, or quaternary semiconductor materials, may be epitaxially grown from the surface of the substrate.

The layers 110 and 910 (and other epitaxial layers described herein) can be formed by epitaxial growth. For example, any of the layers 110 and 910 may be formed using a chemical vapor deposition (CVD) process or atomic layer deposition (ALD) process. A CVD process may include, but not be limited to, a metal-organic chemical vapor deposition (MOCVD) process or ultrahigh vacuum chemical vapor deposition (UHVCVD). Other deposition processes may include hydride vapor phase epitaxy (HVPE) or molecular beam epitaxy (MBE). The layers 110 and 910 can include at least a first transitional layer (e.g., AlN) deposited directly on the substrate 102 followed by one or more gallium nitride material layers and/or other material layers deposited on the first transitional layer. Some of the epitaxial layers can be compositionally graded. A total thickness of the transition layer 112 can be between 0.5 and 4 µm.

Although not illustrated, the semiconductor structures shown in FIGS. 1, 2, 4-6, 8-13, and 14A-14C can include additional layers in some cases. For example, there may be one or more additional layers between the substrate 102 and conduction layer 116 shown in FIG. 1. These layers can include any combination of the following layers: amorphous dielectric (e.g., silicon nitride, oxide) layer(s), compositionally graded layer(s), and strain-relieving layer(s). Such layers may be included to ameliorate stresses arising from deposition of dissimilar materials and/or to improve electrical performance of the device (e.g., reduce parasitic capacitance or leakage currents).

For HEMT or diode devices formed on the layers 110 and 910, according to some embodiments, the conduction layer 116 can comprise GaN or any suitable gallium nitride material. The conduction layer 116 can be formed by epitaxial growth (e.g., by an MOCVD process or any suitable process for forming a crystalline gallium nitride material). If the buffer layer 114 is omitted, the conduction layer 116 can be deposited directly on or above the transition layer 112. A thickness of the conduction layer 116 can be between 0.5 and 4 µm. In some embodiments, the conduction layer can be undoped, though it may be lightly n-type or p-type doped in other embodiments. A band-gap of the conduction layer 116 can be smaller than a band-gap of the adjacent barrier layer 118.

It can be desirable to have a combined thickness of the transition layer 112, the buffer layer 114, and the conduction layer 116 to be at least 4.5 µm, in some embodiments. This can avoid limiting the reverse-bias breakdown voltage of devices formed, due to the vertical epitaxial profile and provide reverse bias tolerance of as much as 2,000 volts. In some cases, the combined thickness of the transition layer 112, the buffer layer 114, and the conduction layer 116 is at least 2.0 µm to provide high reverse bias tolerance. When the combined thickness of these layers is less than about 2.0 µm, larger vertical leakage currents and defects can contribute to device breakdown at lower voltages.

The barrier layer 118 can be formed using any suitable epitaxial growth process and may be deposited directly on or above the conduction layer 116, in some embodiments. A thickness of the barrier layer 118 can be between 10 and 50 nanometers, though other thicknesses may be used in some cases. According to some embodiments, the barrier layer 118 can include any suitable gallium nitride material, and the barrier layer 118 can include one or more layers of different gallium nitride materials (e.g., AlGaN and AlN layers). The barrier layer 118 can be n-type doped, p-type doped, or undoped.

The barrier layer 118 and the conduction layer 116 can form a heterojunction, and thereby create a 2DEG 160 in the conduction layer 116, adjacent to the interface between the conduction layer 116 and the barrier layer 118. The 2DEG 160 can provide a highly conductive path for current flowing between the source 130 and drain 140. According to some embodiments, the conduction layer 116 includes undoped gallium nitride (GaN), and the barrier layer 118 includes undoped aluminum-gallium nitride (AlGaN) having an Al percentage (by mole fraction) between 20% and 40%. In some cases, the barrier layer 118 comprises AlGaN having a mole fraction of Al between 24% and 29%.

The embodiments can include the cap layer 120 in some cases. The cap layer 120 can be formed over the barrier layer 118. The cap layer 120 can be formed from a semiconductor material of the same type as the conduction layer 116. The cap layer 120 may or may not be doped. In some implementations, the cap layer 120 can include a layer of undoped or doped GaN. The cap layer 120 can have a thickness of between 1 and 10 nm. The cap layer 120 can be formed by any suitable epitaxial deposition process (e.g., by ALD or a CVD process). The cap layer 120 can be omitted in some implementations and embodiments.

The conduction layer 116, barrier layer 118, and cap layer 120 can be formed to have low defect densities that are typical for integrated-circuit-grade semiconductor materials. For example, the defect density for each layer may be as high as, but not greater than about $10^9$ cm$^{-2}$ in some implementations, and as high as, but not greater than about 108 cm$^{-2}$ in some embodiments. Defect densities may be higher in the transition layer 112 or in portions of the buffer layer 114.

Although one active device is shown in FIG. 1, any number of active devices can be formed on a wafer and connected together to operate as a single high-power device in other embodiments. Examples of plural high-power devices are described in U.S. patent application Ser. No. 15/223,455, filed Jul. 29, 2016, titled "High-Voltage Lateral GaN-on-Silicon Schottky Diode with Reduced Junction Leakage," and in U.S. patent application Ser. No. 15/223,614, filed Jul. 29, 2016, titled "High-Voltage GaN High Electron Mobility Transistors," both of which are incorporated herein by reference in their entirety.

Any suitable electrically-insulating dielectric layer 122 can be used to isolate the barrier layer 118, the cap layer 120, or both. Example insulator materials include, but are not limited to silicon nitride, silicon oxide, hafnium oxide, aluminum oxide, lanthanum oxide, titanium oxide, zinc oxide, zirconium oxide, gallium oxide, scandium oxide, aluminum nitride, and hafnium nitride. The dielectric layer 122 can be formed by any suitable deposition process, such as chemical vapor deposition, plasma-enhanced chemical vapor deposition, atomic layer deposition, sputtering, or electron-beam evaporation. Other deposition processes may be used in other embodiments.

Among the embodiments, the source 130, source contact 132, drain 140, drain contact 142, gate 150, and gate-connected field plate 152 can be formed from a metal, a metal silicide, metal alloys, a plurality of metal layers, or a highly-doped amorphous semiconductor. Any of the source 130, source contact 132, drain 140, drain contact 142, gate 150, and gate-connected field plate 152 can be formed as one or more layers of the following metals and/or metal alloys in any suitable combination: titanium, nickel, chromium, platinum, palladium, osmium, aluminum, gold, tungsten, rhenium, tantalum, and alloys of titanium and tungsten. In some cases, one or more of the following silicides may be used: platinum silicide, tungsten silicide, nickel silicide, cobalt silicide, titanium silicide, molybdenum silicide, and tantalum silicide. Any of the source 130, source contact 132, drain 140, drain contact 142, gate 150, and gate-connected field plate 152 can be formed by a physical deposition process (e.g., electron-beam deposition, sputtering, or plating process). Thicknesses of the source 130, source contact 132, drain 140, drain contact 142, gate 150, and gate-connected field plate 152 can be between 20 and 200 nm, though other thicknesses may be used in some cases. As particular examples, a thickness of the gate-connected field plate 152 can be between 100 nm and 1.5 µm. Thicknesses of the source 130 and the drain 140 can be between 200 nm and 2 µm.

In some embodiments, one or more of the source 130, source contact 132, drain 140, drain contact 142, gate 150, and gate-connected field plate 152 can be formed from different materials. For example, the source 130 and drain 140 can be formed from a multi-layer structure such as, but not limited to, Ti/Al/Ni/Au, Ti/Al/W, or Ta/Al/Ta. The gate 150 can be formed from a multi-layer structure such as, but not limited to, Ni/Pd/Au/Ti, Ni/Pt/Au/Ti, Ni/Ti/Al/W, Ni/W/Al/W, Ni/Ta/Al/Ta, Ni/Ta/Al/W, Ni/NiO/Al/W, Ni/NiO/Ta/Al/Ta, Ni/NiO/Ta/Al/W, W/Al/W, Ni/WN/Al/W, Ni/NiO/W/Al/W, Ni/NiO/WN/Al/W, WN/Al/W, or Pt/Au/Ti compositions. The gate-connected field plate 152 can be formed from a multi-layer structure such as, but not limited to, Ti/Pt/Au, Al/Cu, or TiN/Cu compositions.

The exact dimensions of the layers and features described herein are limited, to some extent, by the capabilities of the particular manufacturing techniques, processing techniques, and manufacturing steps used to form the layers and features. For example, certain epitaxial growth techniques can offer finer or more exacting layer thicknesses than other techniques, certain deposition techniques can offer finer or more exacting layer thicknesses than other techniques, and certain etching techniques can offer finer or more exacting subtractive techniques, and all of these techniques can vary in precision based on the type(s) of materials being processed. Thus, use of the terms "approximately" and "about" reflects a certain inability (or uncertainty) to precisely control or measure the exact dimensions of the layers and features described herein. The terms "approximately" and "about" may be used to mean within ±20% of a target value for some features, within +10% of a target value for some features, within ±5% of a target value for some features, and within ±2% of a target value for some features. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

The transistors described herein can be formed as field effect transistors (FETs), although the concepts can be applied to other types of transistors. The transistors described herein can include one or more field plates, such as source-connected field plates, gate-connected field plates, or both source-connected and gate-connected field plates. Among other types of FET transistors, the transistors described herein can be formed as HEMTs, pseudomorphic high-electron mobility transistors (pHEMTs), metamorphic high-electron mobility transistors (mHEMTs), and for use as high efficiency power amplifiers. Other GAN-based or III-Nitride-based FETs which may benefit from the semiconductor material substrates described herein include FETs for low frequency power devices used in power management applications for example. The FETs can include metal oxide or insulator semiconductors (MOSFET or MISFET) transistors.

The concepts described herein can be embodied by GaN-on-Si transistors and devices, GaN-on-SiC transistors and devices, as well as other types of semiconductor materials. As used herein, the term "gallium nitride" or GaN refers directly to gallium nitride, exclusive of its alloys. The term "gallium nitride material" or GaN semiconductor material refers to gallium nitride and any of its alloys, such as aluminum gallium nitride ($Al_xGa_{(1-x)}N$), indium gallium nitride ($In_y\,Ga_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), among others. When present in the gallium nitride material, arsenic and/or phosphorous are at low concentrations (e.g., less than 5 weight percent).

In certain embodiments with high concentrations of gallium, gallium nitride material has a high concentration of gallium and includes little or no aluminum or indium. In high gallium concentration embodiments, the sum of (x+y) may be less than 0.4 in some cases, less than 0.2 in some cases, less than 0.1 in some cases, or even less in other cases. In some cases, it is preferable for at least one gallium nitride material layer to have a composition of GaN (i.e., x=y=a=b=0). For example, an active layer in which a majority of current conduction occurs may have a composition of GaN. Gallium nitride materials in a multi-layer stack may be doped n-type or p-type, or may be undoped. Suitable gallium nitride materials are described in U.S. Pat. No. 6,649,287, which is incorporated herein by reference in its entirety.

Although relative terms such as "on," "below," "upper," "lower," "top," "bottom," "right," and "left" may be used to describe the relative spatial relationships of certain structural features, these terms are used for convenience only, as a direction in the examples. It should be understood that if the device is turned upside down, the "upper" component will become a "lower" component. When a structure or feature is described as being "on" (or formed on) another structure or feature, the structure can be positioned directly on (i.e., contacting) the other structure, without any other structures or features intervening between the structure and the other structure. When a structure or feature is described as being "over" (or formed over) another structure or feature, the structure can be positioned over the other structure, with or without other structures or features intervening between them. When two components are described as being "coupled to" each other, the components can be electrically coupled to each other, with or without other components being electrically coupled and intervening between them. When two components are described as being "directly coupled to" each other, the components can be electrically coupled to each other, without other components being electrically coupled between them. When a layer is described as being "on" or "over" another layer or substrate, it may cover the entire layer or substrate, or a portion of the layer or substrate. When a layer is described as being "entirely on" or "entirely over" another layer or substrate, it covers the entire layer or substrate. The terms "on" and "over" are used for ease of explanation relative to the illustrations, and are not intended as absolute directional references. A device may be manufactured and/or implemented in other orientations than shown in the drawing (for example, rotated about a horizontal axis by more than 90 degrees.

Terms such as "a," "an," "the," and "said" are used to indicate the presence of one or more elements and components. The terms "comprise," "include," "have," "contain," and their variants are used to be open ended and may include or encompass additional elements, components, etc., in addition to the listed elements, components, etc., unless otherwise specified. The terms "first," "second," etc. are used only as labels, rather than a limitation for a number of the objects.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

What is claimed is:

1. A semiconductor structure, comprising:
a substrate formed from a first base semiconductor material;
an interface layer formed over the substrate, the interface layer being formed from the first base semiconductor material; and
a number of epitaxial layers formed over the interface layer from a second base semiconductor material, the number of epitaxial layers comprising:
a transition layer formed over the interface layer; and
a conduction layer formed over the transition layer, wherein the substrate is capacitively coupled to the epitaxial layers through the interface layer.

2. The semiconductor structure according to claim 1, wherein the first base semiconductor material is silicon and the second base semiconductor material is gallium nitride material.

3. The semiconductor structure according to claim 1, wherein the interface layer is resistive in a range between 3,000 ohm-cm to 10,000 ohm-cm.

4. The semiconductor structure according to claim 1, wherein the substrate is formed to include at least one conductive region as compared to an intrinsic region of the first base semiconductor material.

5. The semiconductor structure according to claim 4, wherein the at least one conductive region has a resistivity of less than 0.2 ohm-cm.

6. The semiconductor structure according to claim 1, wherein:
the epitaxial layers comprise a superlattice structure;
the superlattice structure comprises repeating pairs of layers; and
each pair of layers in the repeating pairs of layers comprises a first layer of semiconductor material and a second layer of semiconductor material.

7. The semiconductor structure according to claim 6, wherein:
a ratio of a thickness of the first layer of semiconductor material layer to a thickness of the second layer of semiconductor material layer is constant in the superlattice structure;
a thickness of a first pair of layers in the repeating pairs of layers of the superlattice structure is different than a thickness of a second pair of layers; and
the thicknesses of the repeating pairs of layers in the superlattice structure is randomized.

8. The semiconductor structure according to claim 6, wherein:
a ratio of a thickness of the first layer of semiconductor material layer to a thickness of the second layer of semiconductor material layer is different among at least two pairs of layers in the repeating pairs of layers of the superlattice structure.

9. The semiconductor structure according to claim 8, wherein the ratio is randomized among the repeating pairs of layers in the superlattice structure.

10. The semiconductor structure according to claim 6, wherein the first layer of semiconductor material comprises a layer of aluminum nitride (AlN) and the second layer of semiconductor material layer comprises a layer of gallium nitride (GaN).

11. The semiconductor structure according to claim 6, wherein at least one of the first layer of semiconductor material and the second layer of semiconductor material among the repeating pairs of layers in the superlattice structure is doped to form a conductive film.

12. The semiconductor structure according to claim 6, wherein:
a plurality of the first layers of semiconductor material among the repeating pairs of layers in the superlattice structure are doped to form a conductive film; and
the plurality of the first layers of semiconductor material are periodic throughout the superlattice structure.

13. The semiconductor structure according to claim 6, wherein:
a plurality of the first layers of semiconductor material among the repeating pairs of layers in the superlattice structure are doped to form a conductive film; and
the plurality of the first layers of semiconductor material are aperiodic throughout the superlattice structure.

14. The semiconductor structure according to claim 6, wherein the epitaxial layers comprise a second superlattice structure.

15. The semiconductor structure according to claim 14, wherein:
the second superlattice structure comprises repeating pairs of layers;
each pair of layers in the repeating pairs of layers comprises a first layer of semiconductor material and a second layer of semiconductor material;
a ratio of a thickness of the first layer of semiconductor material layer to a thickness of the second layer of semiconductor material layer is constant in the second superlattice structure; and
a thickness of a first pair of layers in the repeating pairs of layers of the second superlattice structure is different than a thickness of a second pair of layers.

16. The semiconductor structure according to claim 14, wherein:
the second superlattice structure comprises repeating groups of more than two layers;
each group of layers in the repeating groups of layers comprises a first layer of semiconductor material, a second layer of semiconductor material, and a third layer of semiconductor material;
a ratio of a thickness of the first, second, and third layers of semiconductor material is constant in the second superlattice structure; and
a thickness of a first group of layers in the repeating groups of layers of the second superlattice structure is different than a thickness of a second group of layers.

17. The semiconductor structure according to claim 1, wherein:
the epitaxial layers further comprise a buffer layer; and
at least a portion of the buffer layer is formed as a resistive layer.

18. The semiconductor structure according to claim 1, wherein:
a mesa is formed from the epitaxial layers; and

US 12,658,876 B2

33 the semiconductor structure further comprises a transistor, the transistor comprising a source, a drain, and a gate over the mesa.

19. The semiconductor structure according to claim 18, further comprising electrically-insulating dielectric material in an area around the mesa.

20. The semiconductor structure according to claim 17, wherein the portion of the buffer layer comprises Magnesium as a dopant.

21. The semiconductor structure according to claim 1, wherein interface layer comprises a doping type opposite to a doping type of the transition layer.

22. The semiconductor structure according to claim 1, wherein the semiconductor structure comprises a diode junction between the interface layer and the transition layer.

* * * * *